(12) United States Patent
Larson, III et al.

(10) Patent No.: US 7,561,009 B2
(45) Date of Patent: Jul. 14, 2009

(54) FILM BULK ACOUSTIC RESONATOR (FBAR) DEVICES WITH TEMPERATURE COMPENSATION

(75) Inventors: John D. Larson, III, Palo Alto, CA (US); John Choy, Westminster, CO (US); Donald E. Lee, Fort Collins, CO (US); Kevin J. Grannen, Thornton, CO (US); Hongjun Feng, Windsor, CO (US); Carrie A. Rogers, Fort Collins, CO (US); Urupattur C. Sridharan, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 376 days.

(21) Appl. No.: 11/291,674

(22) Filed: Nov. 30, 2005

(65) Prior Publication Data

US 2007/0120625 A1    May 31, 2007

(51) Int. Cl.
*H03H 9/15*       (2006.01)
*H03H 9/205*      (2006.01)
*H01L 41/083*     (2006.01)

(52) U.S. Cl. ...................... 333/187; 333/189
(58) Field of Classification Search ............. 333/189, 333/191, 187
See application file for complete search history.

(56) References Cited

U.S. PATENT DOCUMENTS

| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |

(Continued)

FOREIGN PATENT DOCUMENTS

DE    10160617    6/2003

(Continued)

OTHER PUBLICATIONS

R. C. Ruby, P. Merchant, "Micro-Machined Thin Film Bulk Acoustic Resonators", Proc. IEEE 48th, Symposium on Frequency Control, 1994, pp. 135-138.

(Continued)

*Primary Examiner*—Dean O Takaoka

(57) ABSTRACT

The temperature-compensated film bulk acoustic resonator (FBAR) device comprises an FBAR stack that comprises an FBAR characterized by a resonant frequency having a temperature coefficient and a temperature-compensating layer comprising doped silicon dioxide. The FBAR comprises opposed planar electrodes and a piezoelectric element between the electrodes. The piezoelectric element has a temperature coefficient on which the temperature coefficient of the resonant frequency of the FBAR depends at least in part.

38 Claims, 11 Drawing Sheets

U.S. PATENT DOCUMENTS

| | | | |
|---|---|---|---|
| 4,355,408 A | 10/1982 | Scarrott | |
| 4,456,850 A * | 6/1984 | Inoue et al. | 310/324 |
| 4,529,904 A | 7/1985 | Hattersley | |
| 4,625,138 A | 11/1986 | Ballato | |
| 4,640,756 A | 2/1987 | Wang et al. | |
| 4,719,383 A | 1/1988 | Wang et al. | |
| 4,798,990 A | 1/1989 | Henoch | |
| 4,836,882 A | 6/1989 | Ballato | |
| 4,841,429 A | 6/1989 | McClanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,075,641 A | 12/1991 | Weber et al. | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,241,209 A | 8/1993 | Sasaki | |
| 5,241,456 A | 8/1993 | Marcinkiewicz et al. | |
| 5,294,898 A | 3/1994 | Dworsky et al. | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Bolorforosh | |
| 5,587,620 A | 12/1996 | Ruby et al. | |
| 5,589,858 A | 12/1996 | Kadowaki et al. | |
| 5,594,705 A | 1/1997 | Connor et al. | |
| 5,671,242 A | 9/1997 | Takiguchi et al. | |
| 5,692,279 A | 12/1997 | Mang et al. | |
| 5,714,917 A | 2/1998 | Ella | |
| 5,853,601 A | 12/1998 | Krishaswamy et al. | |
| 5,864,261 A | 1/1999 | Weber | |
| 5,872,493 A | 2/1999 | Ella | |
| 5,873,153 A | 2/1999 | Ruby et al. | |
| 5,873,154 A | 2/1999 | Ylilammi et al. | |
| 5,894,647 A | 4/1999 | Lakin | |
| 5,910,756 A | 6/1999 | Ella | |
| 5,932,953 A | 8/1999 | Drees et al. | |
| 5,936,150 A | 8/1999 | Kobrin et al. | |
| 5,953,479 A | 9/1999 | Zhou et al. | |
| 5,962,787 A | 10/1999 | Okada et al. | |
| 5,982,297 A | 11/1999 | Welle | |
| 6,040,962 A | 3/2000 | Kanazawa et al. | |
| 6,060,818 A | 5/2000 | Ruby et al. | |
| 6,087,198 A | 7/2000 | Panasik | |
| 6,107,721 A | 8/2000 | Lakin | |
| 6,111,480 A | 8/2000 | Iyama et al. | |
| 6,124,756 A | 9/2000 | Yaklin et al. | |
| 6,150,703 A | 11/2000 | Cushman et al. | |
| 6,187,513 B1 | 2/2001 | Katakura | |
| 6,215,375 B1 | 4/2001 | Larson, III et al. | |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 | 7/2001 | Bradley et al. | |
| 6,263,735 B1 | 7/2001 | Nakatani et al. | |
| 6,265,246 B1 | 7/2001 | Ruby et al. | |
| 6,278,342 B1 | 8/2001 | Ella | |
| 6,292,336 B1 | 9/2001 | Horng et al. | |
| 6,307,447 B1 | 10/2001 | Barber et al. | |
| 6,307,761 B1 | 10/2001 | Nakagawa | |
| 6,376,280 B1 | 4/2002 | Ruby et al. | |
| 6,377,137 B1 | 4/2002 | Ruby | |
| 6,384,697 B1 | 5/2002 | Ruby | |
| 6,407,649 B1 | 6/2002 | Tikka et al. | |
| 6,414,569 B1 | 7/2002 | Nakafuku | |
| 6,420,820 B1 * | 7/2002 | Larson, III | 310/346 |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Shibata | |
| 6,441,539 B1 | 8/2002 | Kitamura et al. | |
| 6,462,631 B2 | 10/2002 | Bradley et al. | |
| 6,466,105 B1 | 10/2002 | Lobl et al. | |
| 6,466,418 B1 | 10/2002 | Horng et al. | |
| 6,469,597 B2 | 10/2002 | Ruby et al. | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Larson, III et al. | |
| 6,486,751 B1 | 11/2002 | Barber et al. | |
| 6,489,688 B1 | 12/2002 | Baumann et al. | |
| 6,492,883 B2 | 12/2002 | Liang et al. | |
| 6,507,983 B1 | 1/2003 | Ruby et al. | |
| 6,515,558 B1 | 2/2003 | Ylilammi | |
| 6,518,860 B2 | 2/2003 | Ella et al. | |
| 6,525,996 B1 | 2/2003 | Miyazawa | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panaski | |
| 6,550,664 B2 | 4/2003 | Bradley et al. | |
| 6,564,448 B1 | 5/2003 | Oura et al. | |
| 6,566,979 B2 | 5/2003 | Larson, III et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,600,390 B2 | 7/2003 | Frank | |
| 6,601,276 B2 | 8/2003 | Barber | |
| 6,617,249 B2 | 9/2003 | Ruby et al. | |
| 6,617,750 B2 | 9/2003 | Dummermuth et al. | |
| 6,630,753 B2 | 10/2003 | Malik et al. | |
| 6,635,509 B1 | 10/2003 | Ouellet | |
| 6,639,872 B1 | 10/2003 | Rein | |
| 6,651,488 B2 | 11/2003 | Larson, III et al. | |
| 6,657,363 B1 | 12/2003 | Aigner | |
| 6,668,618 B2 | 12/2003 | Larson, III et al. | |
| 6,670,866 B2 * | 12/2003 | Ella et al. | 333/133 |
| 6,693,500 B2 | 2/2004 | Yang et al. | |
| 6,710,508 B2 | 3/2004 | Ruby et al. | |
| 6,710,681 B2 | 3/2004 | Figueredo et al. | |
| 6,714,102 B2 | 3/2004 | Ruby et al. | |
| 6,720,844 B1 * | 4/2004 | Lakin | 333/189 |
| 6,720,846 B2 | 4/2004 | Iwashita et al. | |
| 6,724,266 B2 | 4/2004 | Plazza et al. | |
| 6,774,746 B2 | 8/2004 | Whatmore et al. | |
| 6,777,263 B1 | 8/2004 | Gan et al. | |
| 6,787,048 B2 | 9/2004 | Bradley et al. | |
| 6,788,170 B1 | 9/2004 | Kaitila et al. | |
| 6,803,835 B2 | 10/2004 | Frank | |
| 6,812,619 B1 | 11/2004 | Kaitila et al. | |
| 6,828,713 B2 | 12/2004 | Bradley et al. | |
| 6,842,088 B2 | 1/2005 | Yamada et al. | |
| 6,873,065 B2 | 3/2005 | Haigh et al. | |
| 6,873,529 B2 | 3/2005 | Ikuta | |
| 6,874,211 B2 | 4/2005 | Bradley et al. | |
| 6,874,212 B2 | 4/2005 | Larson, III | |
| 6,888,424 B2 | 5/2005 | Takeuchi et al. | |
| 6,900,705 B2 | 5/2005 | Nakamura et al. | |
| 6,903,452 B2 | 6/2005 | Ma et al. | |
| 6,906,451 B2 | 6/2005 | Yamada et al. | |
| 6,911,708 B2 | 6/2005 | Park | |
| 6,917,261 B2 | 7/2005 | Unterberger | |
| 6,924,583 B2 | 8/2005 | Lin et al. | |
| 6,924,717 B2 | 8/2005 | Ginsburg et al. | |
| 6,927,651 B2 | 8/2005 | Larson, III et al. | |
| 6,936,928 B2 | 8/2005 | Hedler et al. | |
| 6,936,954 B2 | 8/2005 | Peczalski | |
| 6,946,928 B2 | 9/2005 | Larson et al. | |
| 6,954,121 B2 | 10/2005 | Bradley et al. | |
| 6,963,257 B2 | 11/2005 | Ella et al. | |
| 6,975,183 B2 | 12/2005 | Aigner et al. | |
| 6,977,563 B2 | 12/2005 | Komuro et al. | |
| 6,985,052 B2 | 1/2006 | Tikka | |

| | | |
|---|---|---|
| 6,987,433 B2 | 1/2006 | Larson et al. |
| 6,989,723 B2 | 1/2006 | Komuro et al. |
| 6,998,940 B2 | 2/2006 | Metzger |
| 7,019,604 B2 | 3/2006 | Gotoh et al. |
| 7,019,605 B2 | 3/2006 | Larson, III et al. |
| 7,057,476 B2 | 6/2006 | Hwu |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,138,889 B2 | 11/2006 | Lakin |
| 7,170,215 B2 | 1/2007 | Namba et al. |
| 7,173,504 B2 | 2/2007 | Larson |
| 7,187,254 B2 | 3/2007 | Su et al. |
| 7,230,509 B2 | 6/2007 | Stoemmer |
| 7,408,428 B2 * | 8/2008 | Larson, III .................. 333/187 |
| 7,425,787 B2 | 9/2008 | Larson, III |
| 2002/0000646 A1 | 1/2002 | Gooch et al. |
| 2002/0030424 A1 | 3/2002 | Iwata |
| 2002/0121944 A1 | 9/2002 | Larson, III et al. |
| 2002/0121945 A1 | 9/2002 | Ruby et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0141946 A1 | 7/2003 | Ruby et al. |
| 2003/0179053 A1 | 9/2003 | Aigner et al. |
| 2004/0092234 A1 | 5/2004 | Pohjonen |
| 2004/0124952 A1 | 7/2004 | Tikka |
| 2004/0150293 A1 | 8/2004 | Unterberger |
| 2004/0150296 A1 | 8/2004 | Park et al. |
| 2004/0195937 A1 | 10/2004 | Matsubara et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0218488 A1 | 10/2005 | Mie |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0125489 A1 | 6/2006 | Feucht et al. |
| 2006/0132262 A1 | 6/2006 | Fazzio et al. |
| 2006/0164183 A1 | 7/2006 | Tikka |
| 2006/0185139 A1 | 8/2006 | Larson, III et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |

FOREIGN PATENT DOCUMENTS

| | | |
|---|---|---|
| EP | 0865157 | 9/1998 |
| EP | 880227 | 11/1998 |
| EP | 0973256 | 1/2000 |
| EP | 1047189 | 10/2000 |
| EP | 1096259 | 5/2001 |
| EP | 1100196 | 5/2001 |
| EP | 1 100 196 A3 | 2/2002 |
| EP | 1258989 | 11/2002 |
| EP | 1258990 | 11/2002 |
| EP | 1180494 | 3/2003 |
| EP | 1249932 | 3/2005 |
| EP | 1517443 | 3/2005 |
| EP | 1528674 | 5/2005 |
| EP | 1528675 | 5/2005 |
| EP | 1528677 | 5/2005 |
| EP | 1542362 | 6/2005 |
| EP | 1557945 | 7/2005 |
| EP | 1 517 444 A3 | 8/2005 |
| EP | 1575165 | 9/2005 |
| GB | 1207974 | 10/1970 |
| GB | 2411239 | 8/2005 |
| GB | 2418791 | 4/2006 |
| JP | 2002/217676 | 8/2002 |
| WO | WO-98/16957 | 4/1998 |
| WO | WO-01/06647 | 1/2001 |
| WO | WO-01/99276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2005/043752 | 5/2005 |
| WO | WO-2005/043753 | 5/2005 |
| WO | WO 2005/043756 | 5/2005 |
| WO | WO 2006/018788 | 2/2006 |

OTHER PUBLICATIONS

J. D. Larson III, Y. Oshmyansky, "Measurement of Effective $k_t^2$ Q, $R_p$, $R_s$ vs. Temperature for Mo/AlN/Mo Resonators," 2002 IEEE Ultrasonics Symposium, Munich, Germany, Oct. 8011, 2002, pp. 915-919.

T. Aoyama, et al., Diffusion of Boron, Phosphorous, Arsenic and Antimony in Thermally Grown SiliconDioxide, Fujitsu Labs, J. Electromechanical Soc., vol. 146, No. 5, 1999, pp. 1879-1883.

T. E. Parker et al., Temperature-Compensated Surface Acoustic-Wave Devices with SiO2 Film Overlays, J. Appl. Physics, vol. 50, Mar. 1979, pp. 1360-1369.

K. Tsubbouchi et al., "Zero Temperature Coefficient Surface Acoustic Wave Devices using Epitaxial AIN Films", Proc 1982 IEEE Ultrasonics Symposium, San Diego, CA, 1082, pp. 240-245.

S. V. Krishnaswamy et al., "Film Bulk Acoustic Resonator Technology", 1990 IEEE Ultrasonics Symposium, 1990, pp. 529-536.

K. M. Lakin, "Thin Film Resonators and Filters", 1999 IEEE Untrasonics Symposium, Caesar's Tahoe, NV, Oct. 17-20, 1999, pp. 895-906.

K. M. Lakin et al., "Temperature Compensated Bulk Acoustic Thin Film Resonators", 2000 IEEE Ultrasonics Symposium, San Juan, Puerto Rico, Oct. 22-25, 2000, pp. 855-858.

S. Ohta et al., "Temperature Characteristics of Solidly Mounted Piezoelectric Thin Film Resonators", 2003 IEEE Ultrasonics Symposium, Honolulu, HI, Oct. 5-8, 2003, pp. 2011-2015.

L. O. Bauer et al., "Properties of Silicon Implanted with Boron Ions through Thermal Silicon Dioxide", Solid State Electronics, vol. 16, No. 3, Mar. 1973, pp. 289-300.

J. A. Topich, Effects of Ion Implanted Flourine in Silicon Dioxide, Nuclear Instr. And Methods, 1978, pp. 70-73, CECON REC. 25th, May 9-11, 1978, Cleveland, OH.

B. Spangenberg, et al., "Dependence of the Layer Resistance of Boron Implantation in Silicon and the Annealing Conditions", Comptus Rendus de l'Academie Bulgare des Sciences, vol. 33, No. 3, 1980, pp. 325-327.

K. Hara, "Surface Treatment of Quartz Oscillator Plate by Ion Implantation", Oyo Buturi, vol. 47, No. 2, Feb. 1978, pp. 145-146.

J. Ng, et al., "The Diffusion ion-Implanted Boron in Silicon Dioxide", AIP Conf. Proceedings, No. 122, 1984, pp. 20-33.

Search Report dated Dec. 6, 2006 for Patent Application in Great Britian No. 0621907.5.

U.S. Appl. No. 10/971,169, filed Oct. 22, 2004, Larson III, John D., et al.

Holzlohner, Ronald et al., "Accurate Calculation of Eye Diagrams and Bit Error Rates in Optical Transmission Systems Using Linearization", *Journal of Lightwave Technology*, vol. 20, No. 3., (Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003), 1428-1431.

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", *Reprinted from IEEE Trans. Sonics Ultrason.*, vol. SU-21, (Oct. 1974),257-268.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

"Search Report from corresponding application", No. GB0605225.2, (Jun. 26, 2006).

Hadimioglu, B. et al., ""Polymer Films As Acoustic Matching Layers".",*1990 IEEE Ultrasonics Symposium Proceedings*, vol. 3 PP., [Previously submitted as "Polymer Files As Acoustic Matching Layers, 1990 IEEE Ultrasonics Symposium Proceedings. vol. 4 pp. 1227-1340, Dec. 1990". Considered by Examiner on Mar. 20, 2007, (Dec. 1990), 1337-1340.

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

Lobl, H.P. et al., "Piezoelectric Materials for BAW Resonators And Filters", *2001 IEEE Ultrasonics Symposium*, (Jan. 1, 2001),807-811.

Lakin, K.M. "Bulk Acoustic Wave Coupled Resonator Filters", *2002 IEEE International Frequency Control Symposium and PDA Exhibition*, (Jan. 2, 2002),8-14.

Jung, Jun-Phil et al., "Experimental And Theoretical Investigation On The Relationship Between AIN Properties and AIN-Based FBAR Characteristics", *2003 IEEE International Frequency Control Symposium and PDA Exhibition Jointly with the 17th European Frequency and Time Forum*, (Sep. 3, 2003),779-784.

Yang, C.M. et al., "Highly C Axis Oriented AIN Film Using MOCVD For 5GHx Band FBAR Filter", *2003 IEEE Ultrasonics Symposium*, (Oct. 5, 2003),pp. 170-173.

Martin, Steven J., et al., "Development Of A Low Dielectric Constant Polymer For The Fabrication Of Integrated Circuit Interconnect", *12 Advanced Materials*, (Dec. 23, 2000), 1769-1778.

"Examination Report from UK for application", GB 0605971.1. (Aug. 24, 2006).

"Search Report from corresponding application number", GB 0605779.8, (Aug. 23, 2006).

"Examination report corresponding to application No.", GB0605770.7, (Aug. 25, 2006).

"Examination Report corresponding to application No.", GB0605775.6, (Aug. 30, 2006).

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application No.", GB0620657.7, (Nov. 23, 2006).

"A partial copy of GB Search Report for", Application No. GB0522393.8, (Jan. 9, 2006),4 pages.

"A partial copy of GB Search Report for Application No.", GB0525884.3, (Feb. 2, 2006),4 pgs.

Auld, B. A., "Acoustic Resonators", *Acoustic Fields and Waves in Solids*, Second Edition, vol. 11, (1990),250-259.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys.* 54 (10), (Oct. 1983),5893-5910.

"Search Report for Great Britain Patent Application", No. 0617742. 2, (Dec. 13, 2006).

"Search Report in the Great Britian Patent Application", No. 0619698.4, (Nov. 30, 2006).

Choi, Sungjin et al., "Design of Half-Bridge Piezo-Transformer Converters in the AC Adapter Applications", *IEEE 2005*, 244-248.

Coombs, Clyde F., "Electronic Instrument Handbook", Second Edition, McGraw-Hill, Inc. 1995, pp. 5.1 to 5.29.

Fattinger, G. G. et al., "Coupled Bulk Acoustic Wave Resonator Filters: Key technology for single-to-balanced RF filters", 0-7803-8331-1/4/W20.00; IEEE MTT-S Digest 2004, 927-929.

Jiang, Yimin et al., "A Novel Single-Phase Power Factor Correction Scheme", *IEEE 1993*, 287-292.

Li, Yunxiu et al., "AC-DC Converter with Worldwide Range input Voltage by Series and Parallel Piezoelectric Transformer Connection", *35th Annual IEEE Power Electronics Specialists Conference* 2004.

Navas, J. et al., "Miniaturised Battery Charger using Piezoelectric Transformers", *IEEE 2001*, 492-496.

* cited by examiner

FILM BULK ACOUSTIC RESONATOR (FBAR) DEVICES WITH TEMPERATURE COMPENSATION

BACKGROUND

FBAR devices that incorporate one or more film bulk acoustic resonators (FBARs) form part of an ever-widening variety of electronic products, especially wireless products. For example, modern cellular telephones incorporate a duplexer in which each of the band-pass filters includes a ladder circuit in which each element of the ladder circuit is an FBAR. A duplexer incorporating FBARs is disclosed by Bradley et al. in U.S. Pat. No. 6,262,637 entitled Duplexer Incorporating Thin-film Bulk Acoustic Resonators (FBARs), assigned to the assignee of this disclosure and incorporated into this disclosure by reference. Such duplexer is composed of a transmitter band-pass filter connected in series between the output of the transmitter and the antenna and a receiver band-pass filter connected in series with 90° phase-shifter between the antenna and the input of the receiver. The center frequencies of the pass-bands of the transmitter band-pass filter and the receiver band-pass filter are offset from one another. Ladder filters based on FBARs are also used in other applications.

FIG. 1 shows an exemplary embodiment of an FBAR-based band-pass filter 10 suitable for use as the transmitter band-pass filter of a duplexer. The transmitter band-pass filter is composed of series FBARs 12 and shunt FBARs 14 connected in a ladder circuit. Series FBARs 12 have a higher resonant frequency than shunt FBARs 14.

FIG. 2 shows an exemplary embodiment 30 of an FBAR. FBAR 30 is composed a pair of electrodes 32 and 34 and a piezoelectric element 36 between the electrodes. The piezoelectric element and electrodes are suspended over a cavity 44 defined in a substrate 42. This way of suspending the FBAR allows the FBAR to resonate mechanically in response to an electrical signal applied between the electrodes.

United States patent application publication nos. 2005 0 093 654 and 2005 0 093 658, assigned to the assignee of this disclosure and incorporated by reference, disclose a band-pass filter that incorporates a decoupled stacked bulk acoustic resonator (DSBAR) composed of a lower FBAR, an upper FBAR stacked on lower FBAR and an acoustic decoupler between the FBARs. Each of the FBARs is composed of a pair of electrodes and a piezoelectric element between the electrodes. An electrical input signal is applied between electrodes of the lower FBAR and the upper FBAR provides a band-pass filtered electrical output signal between its electrodes. The electrical input signal may alternatively be applied between the electrodes of the upper FBAR, in which case, the electrical output signal is taken from the electrodes of the lower FBAR. Band-pass filters composed of two of the above-described band-pass filters connected in series are described in United States patent application publication no. 2005 0 140 466.

United States patent application publication nos. 2005 0 093 655 and 2005 0 093 656, assigned to the assignee of this disclosure and incorporated by reference, disclose a film acoustically-coupled transformer (FACT) composed of two decoupled stacked bulk acoustic resonators (DSBARs). A first electrical circuit interconnects the lower FBARs of the DSBARs in series or in parallel. A second electrical circuit interconnects the upper FBARs of the DSBARs in series or in parallel. Balanced or unbalanced FACT embodiments having impedance transformation ratios of 1:1 or 1:4 can be obtained, depending on the configurations of the electrical circuits. Such FACTs also provide galvanic isolation between the first electrical circuit and the second electrical circuit.

The FBAR described above with reference to FIG. 2 and devices, such as ladder filters, DSBARs, band-pass filters and FACTs, incorporating one or more FBARs will be referred to generically in this disclosure as FBAR devices.

Most FBAR devices have a frequency response having a band pass characteristic characterized by a center frequency. The constituent FBARs have a frequency response characteristic characterized by a resonant frequency. In practical embodiments of current FBAR devices in which the material of the piezoelectric element is aluminum nitride (AlN) and the material of the electrodes is molybdenum (Mo), the resonant frequency of the FBAR(s) has a temperature coefficient from about −20 ppm/° C. to about −35 ppm/° C. Such temperature coefficients reduce the temperature range over which the FBAR device can meet its pass bandwidth specification. Such temperature coefficients additionally reduce manufacturing yield, because the bandwidth limits to which the FBAR devices are tested have to be inset to ensure that the FBAR device will meet its bandwidth specification over its entire operating temperature range.

Practical embodiments of the above-described FBAR devices are fabricated suspended over a cavity defined in a substrate. To provide a plane surface on which to fabricate the FBAR device, the cavity is filled with sacrificial material near the beginning of the fabrication process. After the FBAR device has been fabricated, the sacrificial material is removed, leaving the FBAR device suspended over the cavity. A typical sacrificial material is phosphosilicate glass, and the sacrificial material is removed from the cavity by a wet etch process that uses hydrofluoric acid (HF) as an etchant. Since the release etch is performed towards the end of the fabrication process, the materials of the FBAR device have to be etch compatible with HF.

What is needed, therefore, is an FBAR device whose resonant frequency has a reduced temperature coefficient and that can be fabricated using materials that are etch compatible with the release etch.

DETAILED DESCRIPTION

Figure 1:
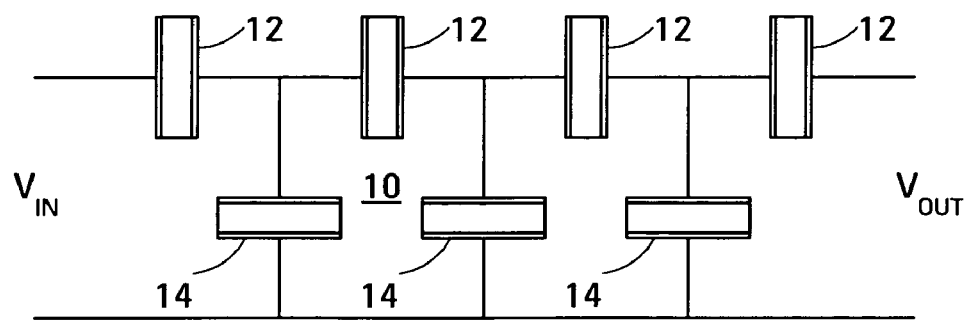
FIG. 1 is a schematic drawing of a ladder filter incorporating FBARs in accordance with the prior art.
Figure 2:
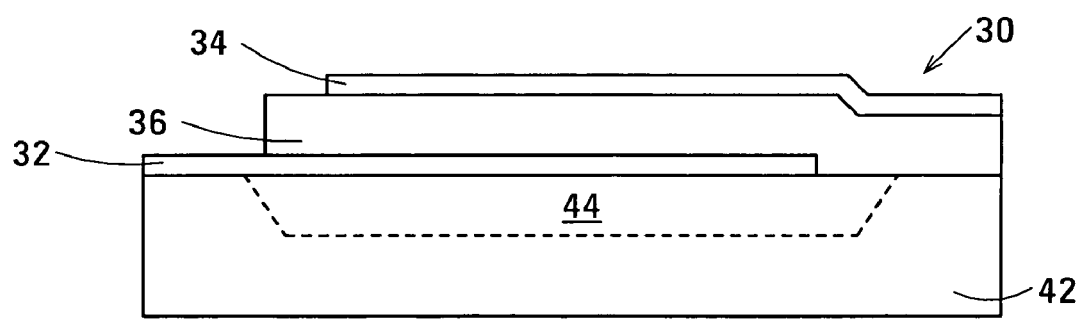
FIG. 2 is a cross-sectional view of an FBAR in accordance with the prior art.

As used in this disclosure, the term FBAR stack refers to a stack of layers of various materials that comprises one or more FBARs. In embodiments in which the FBAR stack comprises more than one FBAR, the FBARs may be at the same level in the FBAR stack or at different levels in the FBAR stack, or some of the FBARs may be at the same level in the FBAR stack and some of the FBARs may be at different levels in the FBAR stack. For example, the FBARs in an FBAR ladder filter are typically at the same level in the FBAR stack, the FBARs in a decoupled stacked bulk acoustic resonator (DSBAR) are at different levels in the FBAR stack and some of the FBARs of a thin-film acoustically-coupled transformer (FACT) are at the same level in the FBAR stack and some of the FBARs of the FACT are at different levels in the FBAR stack.

An FBAR has a resonant frequency that depends directly on the velocity of propagation of sound in the FBAR and that depends inversely on the thicknesses of the layers constituting the FBAR. The velocity of propagation in most of the materials from which FBARs are currently fabricated exhibit a negative temperature coefficient because the inter-atomic forces weaken with increasing temperature. A decrease in these forces results in a decrease in the elastic constant of the material with a concomitant decrease in the velocity of propagation. An increase in temperature causes the velocity of propagation to decrease, and also causes the layers to increase in thickness. Both of these effects tend to reduce the resonant frequency of the FBAR, resulting in the above-described negative temperature coefficient. For example, the temperature coefficients of aluminum nitride (AlN) and molybdenum (Mo) from which FBARs are currently fabricated are about −25 ppm/° C. and −60 ppm/° C. respectively.

The relationship between the overall temperature coefficient of the resonant frequency of the FBAR and the temperature coefficients of the electrodes and piezoelectric element of the FBAR is determined by the relative thicknesses of the electrodes and the piezoelectric element. An FBAR-based duplexer has a receiver ladder filter in which the FBARs typically have relatively thin electrodes and a relatively thick piezoelectric element. The resonant frequency of such FBARs has a temperature coefficient similar to that of AlN, i.e., about −25 ppm/° C. The transmitter ladder filter of the FBAR-based duplexer typically has FBARs with relatively thick electrodes and a relatively thin piezoelectric element. The temperature coefficient of the molybdenum of the electrodes provides a greater contribution to the temperature coefficient of the resonant frequency of the FBAR. Consequently, the resonant frequency of such FBARs has a temperature coefficient in a range from about −35 ppm/° C. to about −40 ppm/° C.

In accordance with the invention, the FBAR stack additionally incorporates at least one temperature-compensating layer that reduces the temperature coefficient of the resonant frequency of the FBAR device. The temperature-compensating layer is a layer of a temperature-compensating material that has a temperature coefficient opposite in sign to that of the piezoelectric element that constitutes part of the FBAR stack. The temperature-compensating material is doped silicon dioxide. Doped silicon dioxide has a positive temperature coefficient and the piezoelectric element has a negative temperature coefficient. Additionally, doped silicon dioxide is etch-compatible with the etchant used to remove the sacrificial material from the cavity over which the FBAR device is fabricated.

With at least one temperature-compensating layer, the effective temperature coefficient of the resonant frequency $TC_{eff}$ of the FBAR becomes, to a first approximation:

$$TC_{eff} = \{(TC_E * t_E) + (TC_P * t_P) + (TC_c * t_c)\}/(t_E + t_P + t_C) \quad (1)$$

where $TC_E$ is the temperature coefficient of the electrode material, $TC_P$ is the temperature coefficient of the material of the piezoelectric element, $TC_C$ is the temperature coefficient of the temperature-compensating material of the temperature-compensating layer(s), $t_E$ is the total thickness of the electrodes, $t_P$ is the thickness of the piezoelectric element and $t_c$ is the total thickness of the temperature-compensating layer(s). The thicknesses are measured in the direction in which sound propagates through the elements during operation of the FBAR device. Equation (1) applies to both longitudinal and shear modes of propagation. Equation (1) ignores the second-order effect of the acoustic impedances of the electrodes, piezoelectric element and temperature-compensating layer(s) on the temperature compensating effect of the temperature-compensating layer(s).

Temperature-compensated FBAR devices in accordance with various embodiments of the invention will now be described. Such embodiments all have a band-pass frequency response characterized by a center frequency. For simplicity, the center frequency of the pass band of the FBAR device will be referred to as the center frequency of the FBAR device. As will be described further below, the FBAR device embodiments are composed in part of layers of various acoustically-transmissive materials whose thickness depends on the wavelength in the acoustically-transmissive material of an acoustic signal nominally equal in frequency to the center frequency of the FBAR device.

In this disclosure, the term quarter-wave layer will be used to denote a layer of acoustically-transmissive material having a nominal thickness t equal to an odd integral multiple of one quarter of the wavelength in the material of an acoustic signal nominally equal in frequency to the center frequency of the FBAR device, i.e.:

$$t \approx (2m+1)\lambda_n/4 \quad (2)$$

where $\lambda_n$ is the wavelength of the above-mentioned acoustic signal in the acoustically-transmissive material and m is an integer equal to or greater than zero. The thickness of a quarter-wave layer may differ from the nominal thickness by approximately ±10% of $\lambda_n/4$. A thickness outside this tolerance range can be used with some degradation in performance, but the thickness of a quarter-wave layer always differs significantly from an integral multiple of $\lambda_n/2$.

Moreover, in this disclosure, a quarter wave layer having a thickness equal to a specific number of quarter wavelengths of the above-mentioned acoustic signal in the material of the layer will be denoted by preceding the term quarter-wave layer by a number denoting the number of quarter wavelengths. For example, the term one quarter-wave layer will be used to denote a layer of acoustically-transmissive material having a nominal thickness t equal to one quarter of the wavelength in the material of an acoustic signal equal in frequency to the center frequency of the acoustic coupler, i.e., t≈$\lambda_n$/4 (m=0 in equation (2)). A one quarter-wave layer is a quarter-wave layer of a least-possible thickness. Similarly, a three quarter-wave layer has a nominal thickness t equal to three quarter wavelengths of the above-mentioned acoustic signal, i.e., t≈3$\lambda_n$/4 (m=1 in equation (2)).

Figure 3A:
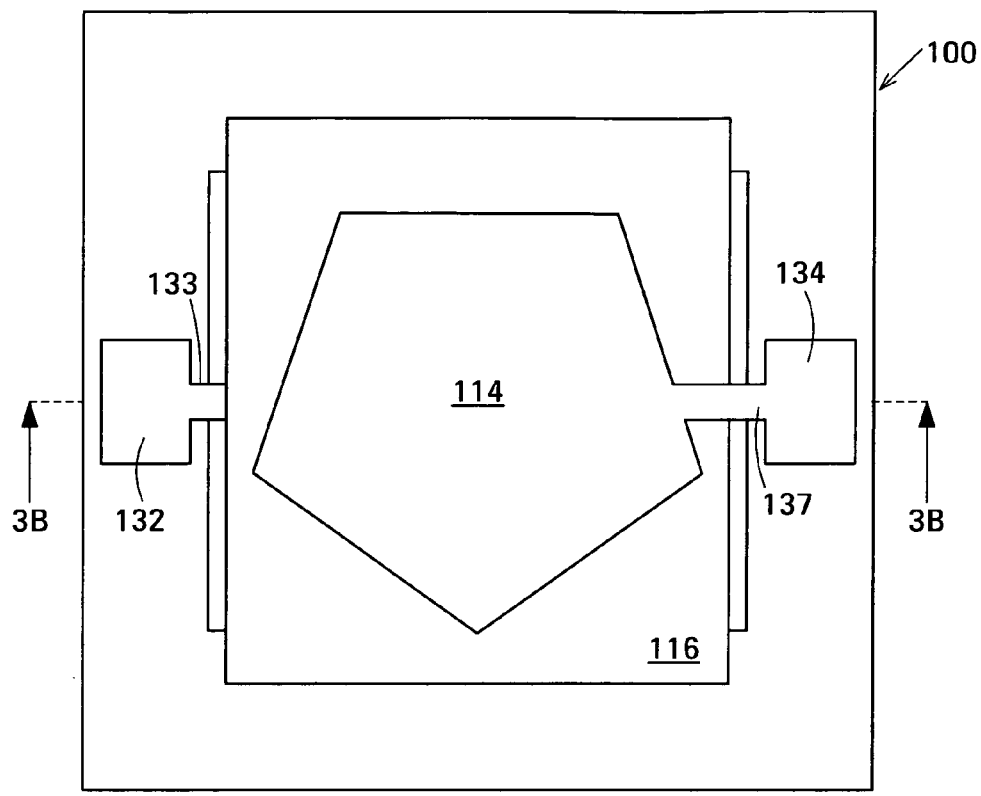
FIG. 3A is a plan view showing an example of an FBAR device in accordance with a first embodiment of the invention.
Figure 3B:
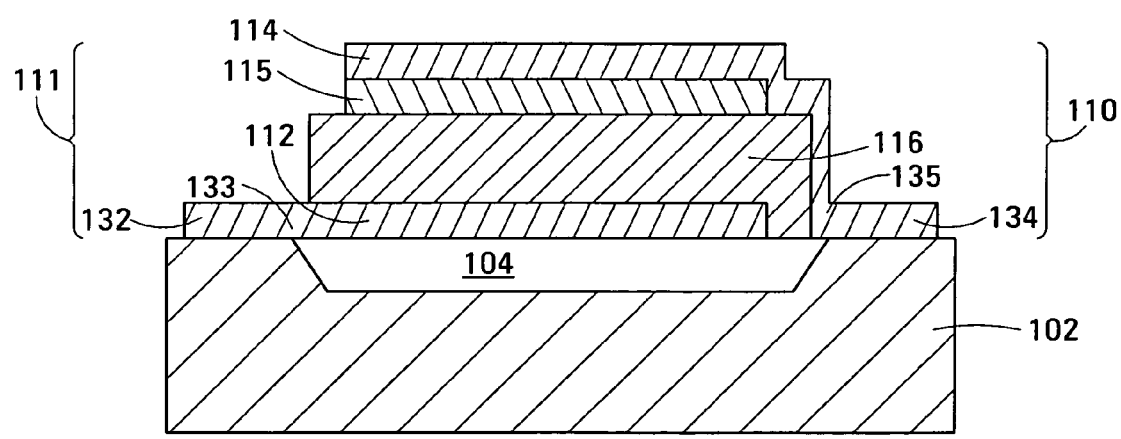
FIG. 3B is a cross-sectional view of the FBAR device shown in FIG. 3A along the section line 3B-3B.

FIGS. 3A and 3B are respectively a plan view and a cross-sectional view showing an example of a temperature-compensated FBAR device 100 in accordance with a first embodiment of the invention. FBAR device 100 comprises an FBAR stack comprising an FBAR. The FBAR is an exemplary FBAR of an FBAR ladder filter, such as the ladder filter shown in FIG. 1, or an exemplary FBAR of an FBAR duplexer. The remaining FBARs of such ladder filter or duplexer also constitute part of the FBAR stack. However, the remaining FBARs are omitted from FIGS. 3A and 3B to simplify the drawing.

FBAR device 100 comprises an FBAR stack 111. FBAR stack 111 comprises an FBAR 110 and a temperature-compensating layer 115. FBAR 110 has opposed planar electrodes 112 and 114 and a piezoelectric element 116 between the electrodes. Piezoelectric element 116 has a temperature coefficient on which the temperature coefficient of the resonant frequency of the FBAR depends at least in part. The resonant frequency typically additionally depends on the temperature coefficient of electrodes 112 and 114. Temperature-compensating layer 115 has a temperature coefficient opposite in sign to the temperature coefficient of the piezoelectric element. As a result of the opposite sign of its temperature coefficient, temperature-compensating layer 115 reduces the effect of the temperature coefficient of the piezoelectric element on the temperature coefficient of FBAR device 100. As a result, the magnitude of the temperature coefficient of FBAR device 100 is less than that of a similar FBAR device without the temperature-compensating layer.

As used in this disclosure, the temperature coefficient of a component of FBAR stack 111, e.g., temperature-compensating layer 115, piezoelectric element 116 and electrodes 112 and 114, is the temperature coefficient of a parameter of the component on which the temperature coefficient of the resonant frequency of FBAR 110 depends. Typically, the parameter is a combination of the propagation velocity of sound in the component and the coefficient of thermal expansion of the component. The parameter may additionally take account of the acoustic impedance of the component.

In the example shown in FIG. 3B, temperature-compensating layer 115 is a layer of temperature-compensating material having a temperature coefficient opposite in sign to the temperature coefficients of the piezoelectric element 116 and the electrodes 112 and 114 of FBAR 110. Specifically, the piezoelectric element and electrodes have a negative temperature coefficient and temperature-compensating layer 115 is a layer of doped silicon dioxide having a positive temperature coefficient.

In the example shown, temperature-compensating layer 114 is located between piezoelectric element 116 and electrode 114, and is juxtaposed with electrode 114. Temperature-compensating layer 115 may alternatively be located between electrode 112 and piezoelectric element 116, juxtaposed with electrode 112. Elements described in this disclosure as juxtaposed typically physically contact one another as shown in FIG. 3B. However, juxtaposed elements may be separated by intervening elements provided such intervening elements have a negligible effect on the acoustical properties of the juxtaposed elements.

Temperature-compensated FBAR device 100 additionally comprises a substrate 102. A cavity 104 is defined in substrate 102 and FBAR stack 111 is suspended over the cavity. Cavity 104 acoustically isolates FBAR stack 111 from substrate 102. FBAR stack 111 is therefore free to vibrate mechanically in response to an electrical signal applied between the electrodes 112 and 114 of FBAR 110. As will be described in more detail below, cavity 104 is filled with sacrificial material (not shown in FIG. 3B, but shown at 105 in FIGS. 6A and 6K), FBAR stack 111 is fabricated on the surface of the sacrificial material and, after the FBAR stack has been fabricated, the sacrificial material is removed from the cavity by etching to leave FBAR stack 111 suspended over cavity 104, as described above.

Silicon dioxide has a positive temperature coefficient of about +100 ppm/° C. and is therefore a candidate temperature-compensating material for use as temperature-compensating layer 115. However, although positive, the temperature coefficient of undoped $SiO_2$ is relatively low, so that temperature-compensating layer 115 has to be relatively thick to reduce the modulus of the temperature coefficient of the resonant frequency of FBAR 110 to approximately zero. In an experimental FBAR similar to FBAR 110 shown in FIGS. 3A and 3B and in which piezoelectric element 116 was a layer of aluminum nitride (AlN) with thickness of 1.2 µm, electrodes 112 and 114 were layers of molybdenum (Mo) with a thickness of 300 nm, and temperature-compensating layer 115 was a layer of undoped $SiO_2$, a thickness of temperature-compensating layer 115 of about 620 nm was needed to reduce the temperature coefficient of the resonant frequency of the FBAR to approximately zero. Such a large thickness of insulating material located in the electric field between electrodes 112 and 114 reduces the coupling constant $k_t^2$ of the FBAR from about 6% to less than 1%. Such a low coupling constant causes unacceptable performance in filters incorporating FBAR devices similar to FBAR device 100.

Moreover, undoped silicon dioxide cannot easily be used in an FBAR device in which hydrofluoric acid (HF) is used to remove the above-mentioned sacrificial material from cavity 104 towards the end of the fabrication process. This is due to the severe etch incompatibility of undoped $SiO_2$ with the release etchant.

In various embodiments of FBAR device 100, described above and to be described below, and in embodiments of FBAR devices 200 and 300 to be described below, the temperature-compensating material of such temperature-compensating layers as temperature-compensating layer 115 is silicon dioxide ($SiO_2$) doped with a group III element. The inventors have discovered that doping silicon dioxide with a group III element raises the temperature coefficient the temperature-compensating material to about +300 ppm/° C. In an embodiment of temperature-compensating layer 115 in which the temperature-compensating material was silicon dioxide doped with boron, a thickness of less than about 80 nm was sufficient to reduce the modulus of the temperature coefficient of the resonant frequency of the FBAR device to about zero. Temperature-compensating layer 115 still reduces the coupling constant, but the coupling constant remains greater than 2%. A coupling constant greater than 2% is sufficient to provide acceptable performance in filters incorporating such FBAR devices. The temperature-compensating layer caused little degradation of the measured Q circle of the FBAR device.

Moreover, silicon dioxide doped with a group III element is etch compatible with the hydrofluoric acid (HF) used to remove sacrificial material from cavity 104 towards the end of the fabrication process. Thus, FBAR devices that are acoustically isolated from the substrate by a cavity defined in the substrate can incorporate a doped silicon dioxide temperature-compensating layer.

The group III elements include boron (B), aluminum (Al), gallium (Ga) and indium (In). A temperature-compensating layer of silicon dioxide doped with a group III element can be deposited by chemical vapor deposition (CVD). Other deposition techniques are known and can be used. Alternatively, undoped silicon dioxide can be deposited, such as by CVD, and can then be doped using ion implantation. The experimental results quoted above were obtained with an FBAR in which the temperature-compensating layer was a layer of silicon dioxide deposited by CVD. After deposition, the silicon dioxide was doped with boron ions implanted with an energy of about 30 keV and a density of about $2.5 \times 10^{15}$ cm$^{-3}$.

Temperature-compensating layer 115 forms part of the acoustically-resonant structure of FBAR 110. To form an FBAR with a specified resonant frequency, the temperature-compensating layer replaces part of one or more of the other components, i.e., the piezoelectric element and the electrodes, of the FBAR. The electro-acoustic properties of doped silicon dioxide are typically inferior to those of the other components of the FBAR. As a result, temperature-compensating layer 115 has the potential to degrade the electro-acoustic properties of embodiments of FBAR 110 relative to those of an otherwise similar conventional FBAR. The increased temperature coefficient resulting from doping the silicon dioxide reduces the degradation of the electro-acoustic properties, since, in accordance with equation (1), the significantly higher temperature coefficient of the doped material compared with undoped material allows the thickness of the temperature-compensating layer to be minimized. This minimizes the reduction in the thicknesses of the other components. Minimizing the thickness of temperature-compensating layer 115 minimizes the effect of the temperature-compensating layer on the electro-acoustic properties of the FBAR device.

Temperature-compensating layer 115 reduces the temperature coefficient of the resonant frequency of FBAR 110. The positive temperature coefficient of the propagation velocity of the temperature-compensating layer offsets at least in part the negative temperature coefficient of the propagation velocity of piezoelectric element 116 and of electrodes 112 and 114. In some embodiments, the thickness of the temperature-compensating layer is set such that the effective temperature coefficient of FBAR 110 is zero. In other embodiments, the thickness of the temperature-compensating layer is set such that the effective temperature coefficient of FBAR 110 remains negative, but is substantially less than the temperature coefficient of a conventional FBAR in which the FBAR stack has no temperature-compensating layer. A reduction in the temperature coefficient of FBAR 110 will increase either or both of the operating temperature range and the manufacturing yield of FBAR 110. A useful increase in manufacturing yield is obtained simply by reducing the temperature coefficient of FBAR device 110 to one half of that of the conventional FBAR.

Alternative structures of FBAR device 100 will now be described with reference to the cross-sectional views shown in FIGS. 3C-3E.

Figure 3C:
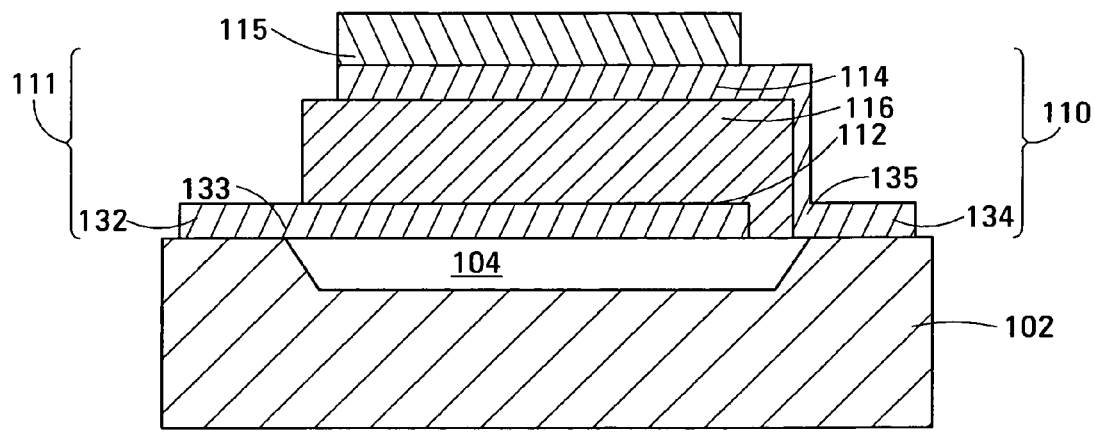
FIGS. 3C-3E are cross-sectional views of alternative structures of the FBAR device shown in FIG. 3A along the section line 3B-3B.

FIG. 3C shows an embodiment of FBAR device 100 in which temperature-compensating layer 115 is juxtaposed with electrode 114 on the opposite side of electrode 114 from piezoelectric element 116. Locating the temperature-compensating layer 115 on the opposite side of electrode 114 from piezoelectric element 116 prevents the insulating temperature-compensating layer from reducing the coupling constant between the electrodes and the piezoelectric element. However, tests have shown that a temperature-compensating layer 115 of a given thickness typically provides more temperature compensation in embodiments, such as that shown in FIG. 3B, in which the temperature-compensating layer is located between electrodes 112 and 114 than in embodiments, such as that shown in FIG. 3C, in which the temperature-compensating layer is located elsewhere.

In the embodiments of FBAR device 100 shown in FIGS. 3B and 3C, FBAR stack 111 is asymmetrical about piezoelectric element 116 due to the presence of temperature-compensating layer 115 juxtaposed with electrode 114, but no corresponding temperature-compensating layer juxtaposed with electrode 112. The thickness of electrode 112 may be increased to restore the symmetry of FBAR stack 111. However, increasing the thickness of electrode 112 increases the temperature coefficient that needs to be compensated by temperature-compensating layer 115. Device asymmetry decreases the coupling constant. However, in some applications, such decreased coupling constant is preferable over increasing the thickness of electrode 112.

Figure 3D:
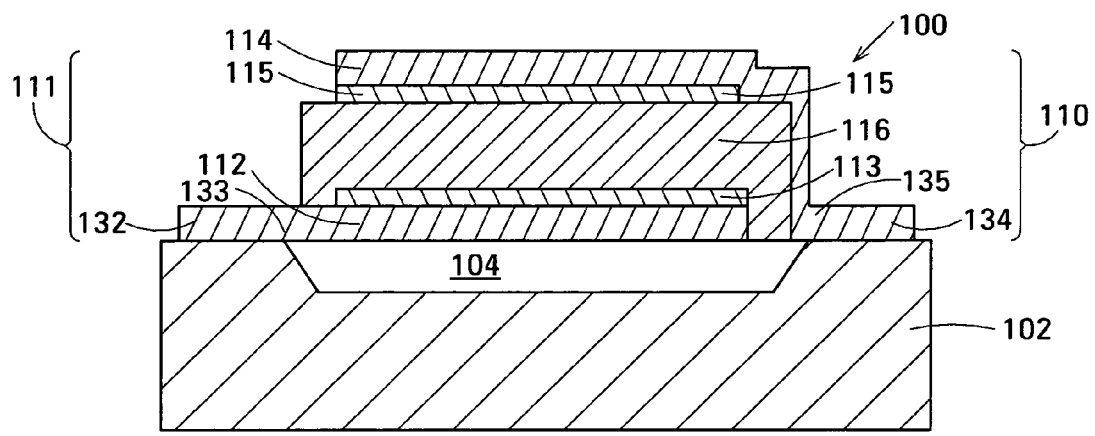

FIG. 3D shows an embodiment of FBAR device 100 in which the symmetry of FBAR stack 111 is restored by incorporating a second temperature-compensating layer 113 into the FBAR stack. Temperature-compensating layer 113 is juxtaposed with electrode 112. In the example shown in FIG. 3D, temperature-compensating layer 113 is located between electrode 112 and piezoelectric element 116. Temperature-compensating layers 113 and 115 are each a layer of doped silicon dioxide and have a temperature coefficient opposite in sign to the temperature coefficients of the piezoelectric element 116 and the electrodes 112 and 114 of FBAR 110. In the embodiment shown in FIG. 3D, the sum of the thicknesses of temperature-compensating layers 113 and 115 is equal to the thickness of temperature-compensating layer 115 shown in FIG. 3B.

In the example shown in FIG. 3D, temperature-compensating layer 113 is located between electrode 112 and piezoelectric element 116 and temperature-compensating layer 115 is located between electrode 114 and piezoelectric element 116. Temperature-compensating layer 113 may alternatively be located on the opposite side of electrode 112 from piezoelectric element 116 and temperature-compensating layer 115 may alternatively be located on the opposite side of electrode 114 from piezoelectric element 116 in a manner similar to that shown in FIG. 3C.

Figure 3E:
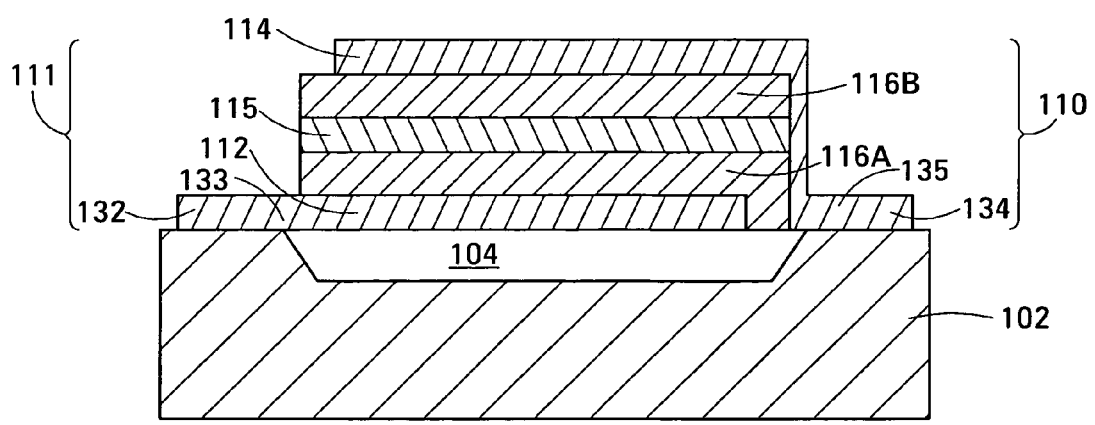

FIG. 3E shows another embodiment of FBAR device 100 in which single temperature-compensating layer 115 is embedded in piezoelectric element 116. This locates temperature-compensating layer 115 part-way through, e.g., half-way through, the thickness of piezoelectric element 116 and provides a symmetrical FBAR stack 111 with only a single temperature-compensating layer. Piezoelectric element 116 has two parts 116A and 116B between which temperature-compensating layer 115 is located.

In the examples of FBAR device 100 shown in FIGS. 3A-3E, FBAR stack 111 may alternatively be isolated from substrate 102 by an acoustic Bragg reflector as disclosed by Lakin in U.S. Pat. No. 6,107,721. Acoustic Bragg reflectors composed of alternate metal Bragg layers and plastic Bragg layers that provide acoustic isolation comparable with that provided by cavity 104 using only one or two pairs of Bragg layers are described by Larson III et al. in United States patent application publication no. 2005 0 104 690, entitled Cavity-less Film Bulk Acoustic Resonator (FBAR) Devices, assigned to the assignee of this application and incorporated by reference.

The above embodiments of FBAR 100 can be regarded an example of an acoustic device comprising an acoustic propagation path that has a propagation time-related property having a temperature coefficient. The propagation path is composed of one or more acoustic propagation elements. The acoustic propagation elements collectively have a temperature coefficient that determines the temperature coefficient of the propagation time-related property at least in part. The propagation path is additionally composed of at least one temperature-compensating layer of doped silicon dioxide, whose temperature coefficient is opposite in sign to the temperature coefficient of the acoustic propagation elements. As used in this disclosure, the terms acoustic and sound encompass a much broader range of vibrational frequencies than the audio frequency range.

In the example shown in FIG. 3B, the propagation time-related property is the resonant frequency of FBAR 110. The acoustic propagation path extends from electrode 112 to electrode 114 and the acoustic propagation elements are electrode 112, electrode 114 and piezoelectric element 116. The acoustic propagation elements collectively have a temperature coefficient that causes the propagation time-related property of the acoustic propagation path to have a negative temperature coefficient. Also included in the acoustic propagation path is temperature-compensating layer 115. Temperature-compensating layer 115 has a positive temperature coefficient opposite in sign to that of the acoustic propagation elements. Temperature-compensating layer 115 reduces the magnitude of the temperature coefficient of the propagation time-related property of the acoustic propagation path. In the embodiment shown in FIG. 3C, the acoustic propagation path extends from electrode 112 to temperature-compensating layer 115.

Other examples of the above-described acoustic device include surface acoustic wave (SAW) filters, crystal filters, coupled-resonator filters and delay lines.

Figure 4A:
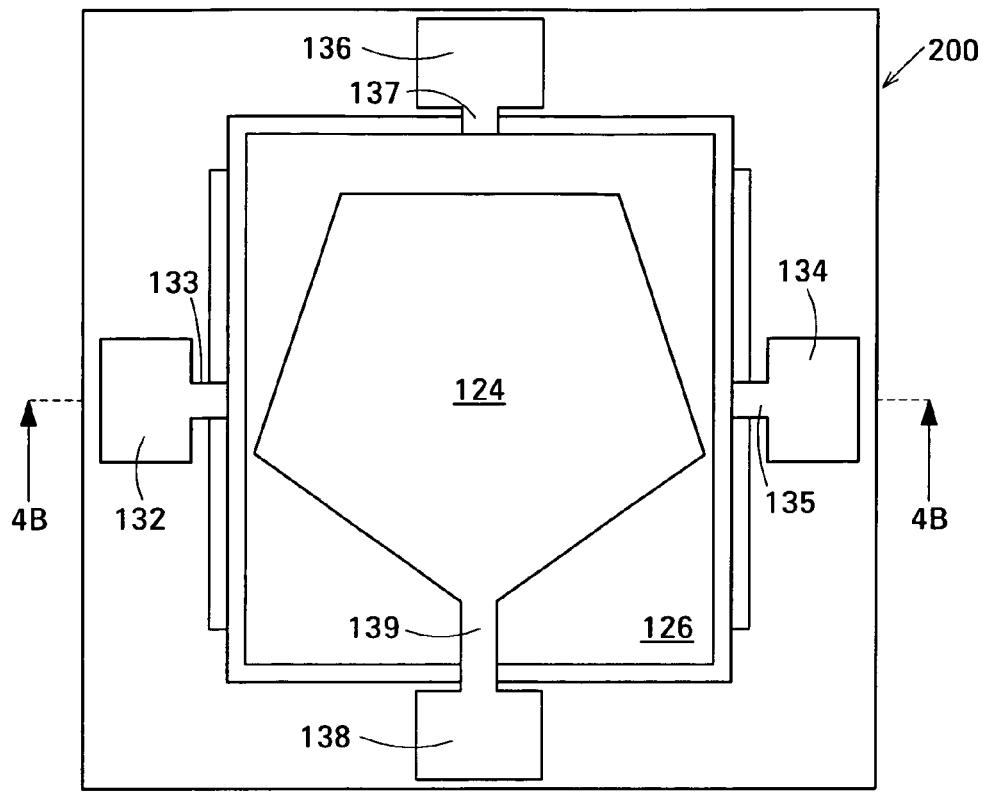
FIG. 4A is a plan view showing an example of an FBAR device in accordance with a second embodiment of the invention.
Figure 4B:
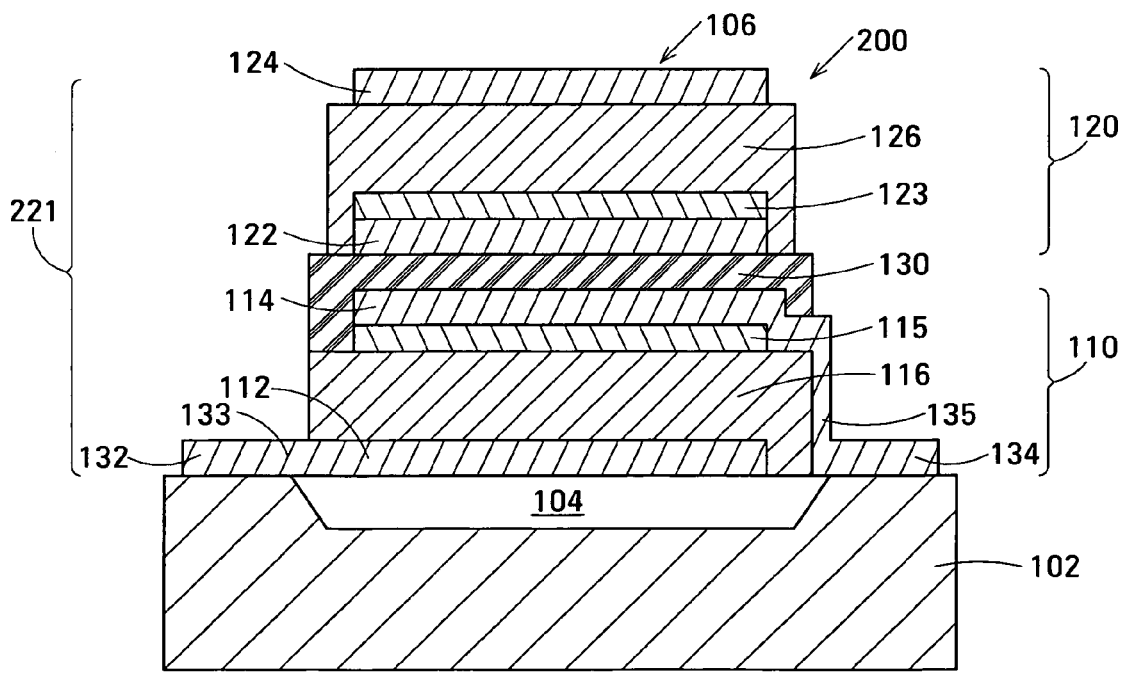
FIG. 4B is a cross-sectional view of the FBAR device shown in FIG. 4A along the section line 4B-4B.

FIGS. 4A and 4B are respectively a plan view and a cross-sectional view showing an example of a temperature-compensated FBAR device 200 in accordance with a second embodiment of the invention. FBAR device 200 is a band-pass filter in which the FBAR stack is composed of two FBARs and an acoustic decoupler between the FBARs. The FBARs and the acoustic decoupler constitute a single decoupled stacked bulk acoustic resonator (DSBAR).

FBAR device 200 comprises an FBAR stack 211. FBAR stack 211 comprises FBAR 110, described above, an FBAR 120, an acoustic decoupler 130 and temperature-compensating layers 115 and 123. FBAR 110 is a lower FBAR in the FBAR stack. FBAR 120 is an upper FBAR and is stacked on lower FBAR 110. Acoustic decoupler 130 is located between FBAR 110 and FBAR 120.

Lower FBAR 110 has opposed planar electrodes 112 and 114 and a piezoelectric element 116 between the electrodes. Piezoelectric element 116 has a temperature coefficient on which the temperature coefficient of the resonant frequency of FBAR 110 depends at least in part. The resonant frequency of FBAR 110 typically additionally depends on the temperature coefficient of electrodes 112 and 114. Upper FBAR 120 has opposed planar electrodes 122 and 124 and a piezoelectric element 126 between the electrodes. Piezoelectric element 126 has a temperature coefficient on which the temperature coefficient of the resonant frequency of FBAR 120 depends at least in part. The resonant frequency of FBAR 120 typically additionally depends on the temperature coefficient of electrodes 122 and 124. Temperature-compensating layers 115 and 123 are layers of doped silicon dioxide, which has a temperature coefficient opposite in sign to the temperature coefficient of piezoelectric elements 116 and 126.

As a result of the opposite sign of the temperature coefficient of doped silicon dioxide, temperature-compensating layers 115 and 123 reduce the effect of the temperature coefficient of piezoelectric elements 116 and 126, and typically additionally the effect of the temperature coefficient of electrodes 112, 114, 122 and 124, on the temperature coefficient of FBAR device 200. As a result, the magnitude of the temperature coefficient of FBAR device 200 is less than that of a similar FBAR device without temperature-compensating layers.

In the example shown in FIG. 4B, temperature-compensating layer 115 is located in FBAR 110 between electrode 114 and piezoelectric element 116 and temperature-compensating layer 123 is located in FBAR 120 between electrode 122 and piezoelectric element 126.

Alternatively, temperature-compensating layers 115 and 123 may be located in FBAR stack 211 relative to FBARs 110 and 120 in any of the configurations described above with reference to FIGS. 3C and 3E. An additional temperature-compensating layer (not shown) may alternatively be juxtaposed with each of the electrodes 112 and 124 in a manner similar to that described above with reference to FIG. 3D. However, an embodiment in which temperature-compensating layers 115 and 123 are respectively juxtaposed with electrode 114 of FBAR 110 and with electrode 122 of FBAR 120, and in which electrodes 114 and 122 are juxtaposed with acoustic decoupler 130, as shown in FIG. 4B, is typically more effective at providing temperature compensation than configurations in which the temperature-compensating layers are located elsewhere.

In FBAR device 200, acoustic decoupler 130 is located between FBARs 110 and 120, specifically, between electrode 114 of FBAR 110 and electrode 122 of FBAR 120. The acoustic decoupler controls the coupling of acoustic energy between FBARs 110 and 120. The acoustic decoupler couples less acoustic energy between the FBARs than would be coupled by direct contact between the FBARs. In the example shown in FIG. 4B, acoustic decoupler 130 is composed of an acoustic decoupling layer of acoustic decoupling material. A Bragg structure may alternatively be used as acoustic decoupler 130, as described by Larson III in United States patent application publication no. 2005 0 093 653, assigned to the assignee of this disclosure and incorporated by reference.

In the example shown, FBAR stack 211 is suspended over cavity 104 defined in substrate 102. Cavity 104 acoustically isolates FBAR stack 211 from substrate 102. The acoustic isolation between FBAR stack 211 and substrate 102 allows the FBARs 110 and 120 constituting DSBAR 106 to resonate mechanically in response to an input electrical signal applied between the electrodes of one of them. The acoustic energy generated in the FBAR that receives the input electrical signal passes through acoustic decoupler 130 into the other FBAR. The FBAR receiving the acoustic energy converts part of the acoustic energy into an electrical output signal provided between its electrodes. The electrical signal output between the electrodes of the FBAR receiving the acoustic energy has a band-pass frequency response characteristic substantially free of undesirable spurious artifacts arising from undesirable acoustic coupling between FBAR stack 211 and substrate 102.

In the example shown, the electrodes 112 and 114 of FBAR 110 are electrically connected to terminal pads 132 and 134, respectively, by electrical traces 133 and 135, respectively. Additionally, the electrodes 122 and 124 of FBAR 120 are electrically connected to terminal pads 136 and 138, respectively, by electrical traces 137 and 139. In an embodiment that does not provide galvanic isolation between input and output, electrical trace 137 is connected to terminal pad 134 and terminal pad 136 is omitted. Terminal pads 132, 134, 136 and 138 are used to make electrical connections from FBAR device 200 to external electrical circuits (not shown).

In the example shown, acoustic decoupler 130 is a quarter-wave layer of acoustic decoupling material. The acoustic impedance of the acoustic decoupling material is less that of the materials of FBARs 110 and 120 and is substantially greater than that of air. The acoustic impedance of a material is the ratio of stress to particle velocity in the material and is measured in Rayleighs, abbreviated as rayl. The acoustic impedances of the materials of the FBARs are typically greater than 30 Mrayl (35 Mrayl for AlN and 63 Mrayl for Mo) and the acoustic impedance of air is about 1 krayl. In embodiments of FBAR device 200 in which the materials of FBARs 110, 120 are as stated above, acoustic decoupling materials with an acoustic impedance in the range from about 2 Mrayl to about 8 Mrayl work well as the acoustic coupling material of acoustic decoupler 130.

The frequency response of an embodiment of FBAR device 200 in which acoustic decoupler 130 is embodied as a one-quarter wave layer of acoustic decoupling material is less likely to exhibit spurious artifacts than an embodiment in which the acoustic decoupler is embodied as a three or more quarter-wave layer of acoustic decoupling material. The frequency response the embodiment having the thicker acoustic decoupler is more likely to exhibit spurious artifacts due to the ability of the thicker acoustic decoupler to support multiple acoustic modes.

Many plastic materials have acoustic impedances in the above-described range from about 2 Mrayl to about 8 Mrayl and can be applied in layers of uniform thickness in the thickness ranges stated above. Such plastic materials are therefore potentially suitable for use as the acoustic decoupling material of acoustic decoupler 130. However, the acoustic decoupling material must also be capable of withstanding the temperatures of the fabrication operations performed after acoustic decoupler 130 has been fabricated. As will be described in more detail below, in practical embodiments of FBAR device 200, electrodes 122 and 124 and piezoelectric layer 126 are deposited by sputtering after acoustic decoupler 130 has been fabricated. Temperatures as high as 400° C. are reached during these deposition processes. Thus, a plastic that remains stable at such temperatures is used as the acoustic decoupling material.

Plastic materials typically have a very high acoustic attenuation per unit length compared with the other materials of FBARs 110 and 120. However, since the plastic acoustic decoupler 130 is typically less than 1 μm thick, e.g., 200 nm thick, the acoustic attenuation introduced by such embodiment of acoustic decoupler 130 is typically negligible.

In one embodiment, a polyimide is used as the acoustic decoupling material of acoustic decoupler 130. Polyimide is sold under the trademark Kapton® by E. I. du Pont de Nemours and Company. In such embodiment, acoustic decoupler 130 is composed of a quarter-wave layer, typically a one quarter-wave layer, of polyimide applied to electrode 114 by spin coating. Polyimide has an acoustic impedance of about 4 Mrayl.

In another embodiment, a poly(para-xylylene) is used as the acoustic decoupling material of acoustic decoupler 130. In such embodiment, acoustic decoupler 130 is composed of a quarter-wave layer, typically a one quarter-wave layer, of poly(para-xylylene) applied to electrode 114 by vacuum deposition. Poly(para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl.

In another embodiment, a crosslinked polyphenylene polymer is used as the acoustic decoupling material of acoustic decoupler 130. In such embodiment, acoustic decoupler 130 is a quarter-wave layer, typically a one quarter-wave layer, of a crosslinked polyphenylene polymer applied by spin coating. Crosslinked polyphenylene polymers have been developed as low dielectric constant dielectric materials for use in integrated circuits and consequently remain stable at the high temperatures to which acoustic decoupler 130 is subject during the subsequent fabrication of FBAR 120. Crosslinked polyphenylene polymers additionally have a calculated acoustic impedance of about 2 Mrayl. This acoustic impedance is in the range of acoustic impedances that provides FBAR device 200 with a useful pass bandwidth.

Precursor solutions containing various oligomers that polymerize to form respective crosslinked polyphenylene polymers are sold by The Dow Chemical Company, Midland, Mich. under the trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl, i.e., about 2 Mrayl.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents, then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., *Development of Low-Dielectric Constant Polymer for the Fabrication of Integrated Circuit Interconnect*, 12 ADVANCED MATERIALS, 1769 (2000), also incorporated by reference. Compared with polyimide, crosslinked polyphenylene polymers are lower in acoustic impedance, lower in acoustic attenuation and lower in dielectric constant. Moreover, a spun-on layer of the precursor solution is capable of producing a high-quality film of the crosslinked polyphenylene polymer with a thickness of the order of 200 nm, which is a typical thickness of acoustic decoupler 130.

In an alternative embodiment, acoustic decoupler 130 is composed of acoustic decoupling layers (not shown) of acoustic decoupling materials having different acoustic impedances as described by Larson III et al. in the United States patent application publication no. 2005 0 093 658 entitled Pass Bandwidth Control in Decoupled Stacked Bulk Acoustic Resonator Devices, assigned to the assignee of this disclosure and incorporated by reference.

In an alternative embodiment, the acoustic impedance of the acoustic decoupling material of acoustic decoupler 130 is substantially greater than that of the materials of FBARs 110 and 120. No acoustic decoupling materials having this property are known at this time, but such materials may become available in future. Alternatively, FBAR materials with lower acoustic impedances may become available in future. The thickness of acoustic decoupler 130 of such high acoustic impedance acoustic decoupling material is as described above.

In another embodiment (not shown), acoustic decoupler 130 is structured as a Bragg structure composed of a low acoustic impedance Bragg element sandwiched between high acoustic impedance Bragg elements. The low acoustic impedance Bragg element is a quarter-wave layer of a low acoustic impedance material whereas the high acoustic impedance Bragg elements are each a quarter-wave layer of a high acoustic impedance material. The acoustic impedances of the Bragg elements are characterized as "low" and "high" with respect to one another and additionally with respect to the acoustic impedance of the piezoelectric material of piezoelectric elements 116 and 126. At least one of the Bragg elements additionally has a high electrical resistivity and a low dielectric permittivity to provide electrical isolation between input and output of FBAR device 200.

In some embodiments in which acoustic decoupler 130 is structured as a Bragg structure, doped silicon dioxide can be used as the high acoustic impedance material and a crosslinked polyphenylene polymer can be used as the low acoustic impedance material. In such embodiments, the high acoustic impedance Bragg element of doped $SiO_2$ can additionally serve as temperature-compensating layer 105 for both lower FBAR 110 and upper FBAR 120. This structure provides temperature compensation without locating a non-conducting temperature-compensating layer between electrodes 112 and 114 and between electrodes 122 and 124. The temperature-compensating layer is an n quarter-wave layer, where n is chosen to provide FBAR device 200 with a temperature coefficient that approximates a desired temperature coefficient.

Figure 5A:
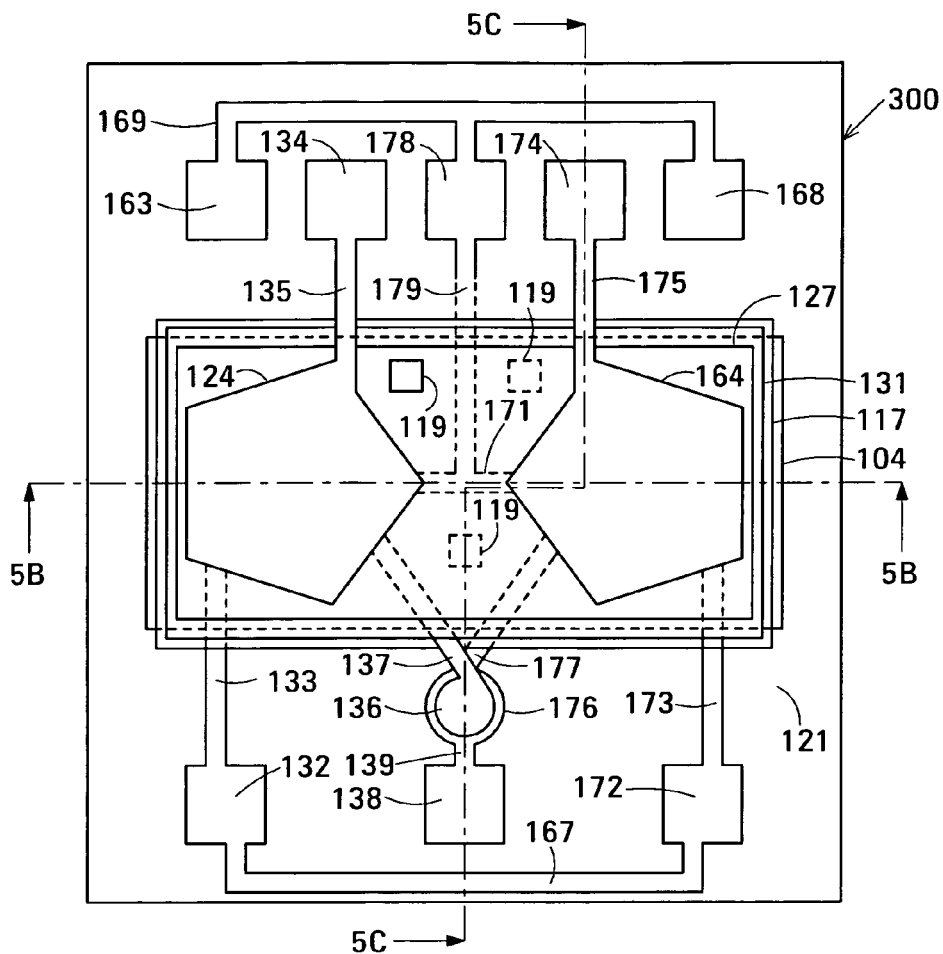
FIG. 5A is a plan view showing an example of an FBAR device in accordance with a third embodiment of the invention.
Figure 5B:
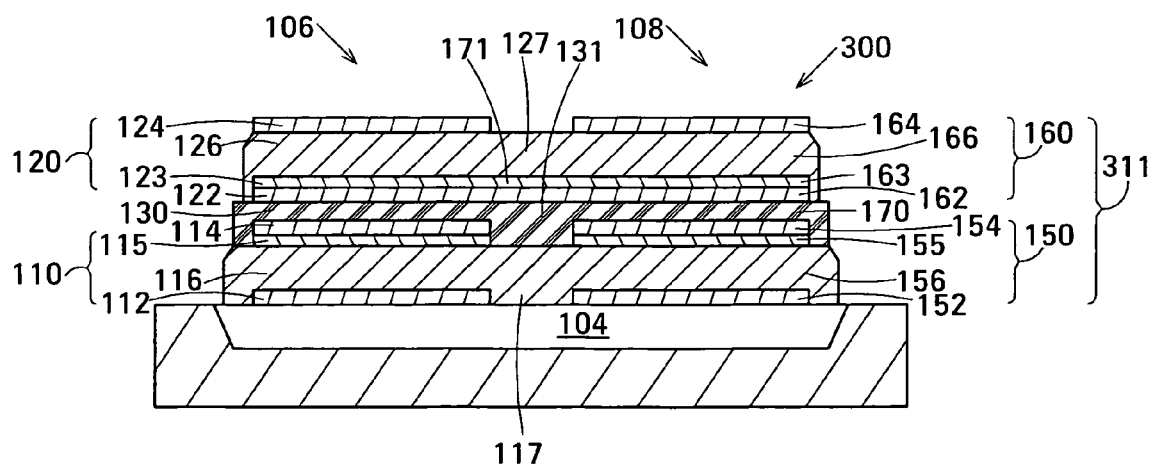
FIG. 5B is a cross-sectional view of the FBAR device shown in FIG. 5A along the section line 5B-5B.
Figure 5C:
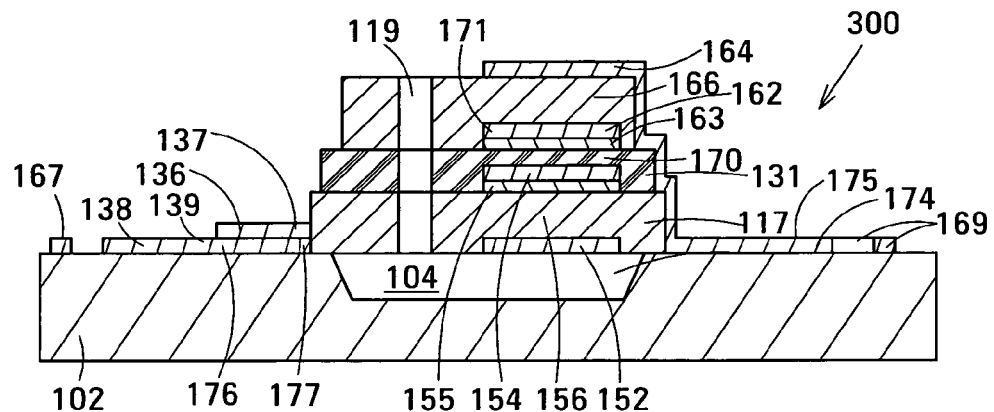
FIG. 5C is a cross-sectional view of the FBAR device shown in FIG. 5A along the section line 5C-5C.
Figure 5D:
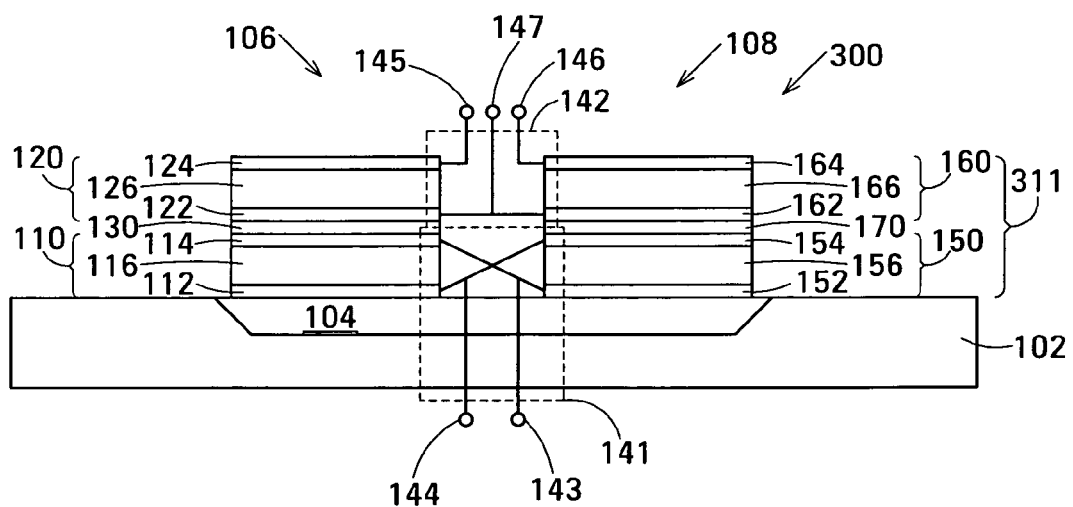
FIG. 5D is a schematic diagram showing the electrical circuits of the FBAR device shown in FIG. 5A.

FIG. 5A is a plan view showing an example of a temperature-compensated FBAR device 300 in accordance with a third embodiment the invention. FBAR device 300 is a film acoustically-coupled transformer (FACT) in which the FBAR stack is composed of four FBARs arranged as two decoupled stacked bulk acoustic resonators (DSBARs). FIGS. 5B and 5C are cross-sectional views along the section lines 5B-5B and 5C-5C, respectively, in FIG. 5A. FIG. 5D is a schematic drawing of the electrical circuits of the example of FACT 300 shown in FIG. 5A and described below.

FBAR device 300 comprises an FBAR stack 311. FBAR stack 311 comprises an FBAR 110, described above, and temperature-compensating layer 115. FBAR 110 is a lower FBAR in the FBAR stack. FBAR stack 311 additionally comprises an upper FBAR 120 stacked on lower FBAR 110, an acoustic decoupler 130 between FBARs 110 and 120, and temperature-compensating layer 123. FBAR 110, FBAR 120 and acoustic decoupler 130 constitute the above-described DSBAR 106. FBAR stack 311 additionally comprises a second DSBAR 108 composed of a lower FBAR 150, an upper FBAR 160 stacked on lower FBAR 150, an acoustic decoupler 170 between FBARs 150 and 160 and temperature-compensating layers 155 and 163.

FACT 300 is additionally composed of an electrical circuit that interconnects the lower FBAR 110 of DSBAR 106 and the lower FBAR 150 of DSBAR 108, and an electrical circuit that interconnects the upper FBAR 120 of DSBAR 106 and the upper FBAR 160 of DSBAR 108. FIG. 5D shows an example in which an electrical circuit 141 connects the lower FBAR 110 of DSBAR 106 and the lower FBAR 150 of DSBAR 108 in anti-parallel, and an electrical circuit 142 connects the upper FBAR 120 of DSBAR 106 and the upper FBAR 160 of DSBAR 108 in series.

In DSBAR 106, lower FBAR 110 is composed of opposed planar electrodes 112 and 114 and piezoelectric element 116 between the electrodes. Piezoelectric element 116 has a temperature coefficient on which the temperature coefficient of the resonant frequency of FBAR 110 depends at least in part. The resonant frequency of FBAR 110 typically additionally depends on the temperature coefficient of electrodes 112 and 114. Upper FBAR 120 is composed of opposed planar electrodes 122 and 124 and piezoelectric element 126 between the electrodes. Upper FBAR 120 has opposed planar electrodes 122 and 124 and a piezoelectric element 126 between the electrodes. Piezoelectric element 126 has a temperature coefficient on which the temperature coefficient of the resonant frequency of FBAR 120 depends at least in part. The resonant frequency of FBAR 120 typically additionally depends on the temperature coefficient of electrodes 122 and 124. Temperature-compensating layers 115 and 123 are layers of doped silicon dioxide, which has a temperature coefficient opposite in sign to the temperature coefficient of piezoelectric elements 116 and 126.

In DSBAR 108, lower FBAR 150 is composed of opposed planar electrodes 152 and 154 and a piezoelectric element 156 between the electrodes. Piezoelectric element 156 has a temperature coefficient on which the temperature coefficient of the resonant frequency of FBAR 150 depends at least in part. The resonant frequency of FBAR 150 typically additionally depends on the temperature coefficient of electrodes 152 and 154. Upper FBAR 160 is composed of opposed planar electrodes 162 and 164 and a piezoelectric element 166 between the electrodes. Piezoelectric element 166 has a temperature coefficient on which the temperature coefficient of the resonant frequency of FBAR 160 depends at least in part. The resonant frequency of FBAR 160 typically additionally depends on the temperature coefficient of electrodes 162 and 164. Temperature-compensating layers 155 and 163 are layers of doped silicon dioxide, which has a temperature coefficient opposite in sign to the temperature coefficient of piezoelectric elements 156 and 166.

As a result of the opposite sign of the temperature coefficient of doped silicon dioxide, temperature-compensating layers 115, 123, 155 and 163 reduce the effect of the temperature coefficient of piezoelectric elements 116, 126, 156 and 166, and typically additionally the effect of the temperature coefficient of electrodes 112, 114, 122, 124, 152, 154, 162 and 166, on the temperature coefficient of FBAR device 300. As a result, the magnitude of the temperature coefficient of FBAR device 300 is less than that of a similar FBAR device without temperature-compensating layers.

In the example shown in FIG. 5B, temperature-compensating layer 115 is located in FBAR 110 between electrode 114 and piezoelectric element 116, temperature-compensating layer 123 is located in FBAR 120 between electrode 122 and piezoelectric element 126, temperature-compensating layer 155 is located in FBAR 150 between electrode 154 and piezoelectric element 156 and temperature-compensating layer 163 is located in FBAR 160 between electrode 162 and piezoelectric element 166.

Alternatively, temperature-compensating layers 115, 123, 155 and 163 may be located in FBAR stack 311 relative to FBARs 110, 120, 150 and 160 in any of the configurations described above with reference to FIGS. 3B, 3D and 3E. An additional temperature-compensating layer (not shown) may alternatively be juxtaposed with each of the electrodes 112, 124, 152 and 164 in a manner similar to that described above with reference to FIG. 3D. However, an embodiment in which temperature-compensating layers 115 and 123 are respectively juxtaposed with electrode 114 of FBAR 110 and with electrode 122 of FBAR 120, and electrodes 114 and 122 are juxtaposed with acoustic decoupler 130, and in which temperature-compensating layers 155 and 163 are respectively juxtaposed with electrode 154 of FBAR 150 and with electrode 162 of FBAR 160, and electrodes 154 and 162 are juxtaposed with acoustic decoupler 170, as shown in FIG. 5B, is typically more effective at providing temperature compensation than configurations in which the temperature-compensating layers are located elsewhere.

In FACT 300, acoustic decoupler 130 of DSBAR 106 is located between lower FBAR 110 and upper FBAR 120; specifically, between electrode 114 of lower FBAR 110 and electrode 122 of upper FBAR 120. Acoustic decoupler 130 controls the coupling of acoustic energy between FBARs 110 and 120. Acoustic decoupler 130 couples less acoustic energy between the FBARs 110 and 120 than would be coupled if the FBARs were in direct contact with one another. Additionally, acoustic decoupler 170 of DSBAR 108 is located between FBARs 150 and 160; specifically, between electrode 154 of lower FBAR 150 and electrode 162 of upper FBAR 160. Acoustic decoupler 170 controls the coupling of acoustic energy between FBARs 150 and 160. Acoustic decoupler 170 couples less acoustic energy between the FBARs 150 and 160 than would be coupled if the FBARs were in direct contact with one another. The coupling of acoustic energy defined by acoustic decouplers 130 and 170 determines the pass bandwidth of FACT 300.

In the example shown in FIGS. 5A-5C, acoustic decouplers 130 and 170 are respective parts of an acoustic decoupling layer 131. In other embodiments, acoustic decouplers 130 and 170 are each composed of acoustic decoupling layers of acoustic decoupling materials having different acoustic impedances, as described above. In other embodiments, acoustic decouplers 130 and 170 are structurally independent.

Acoustic decouplers 130 and 170 may alternatively be Bragg structures as described above with reference to FIGS. 4A and 4B. In some of such Bragg structures, a temperature-compensating layer of doped $SiO_2$ additionally serves as the, one of the, or more than one of the acoustic Bragg elements of the Bragg structure, as described above.

FIG. 5D schematically shows an example of the electrical circuits that interconnect DSBARs 106 and 108 and connect DSBARs 106 and 108 to external electrical circuits (not shown). Electrical circuit 141 connects lower FBARs 110 and 150 in anti-parallel and to signal terminal 143 and ground terminal 144. In the embodiment shown in FIGS. 5A-5C, terminal pad 138 provides signal terminal 143 and terminal pads 132 and 172 provide ground terminal 144. In the embodiment, electrical circuit 141 is provided by an electrical trace 133 that extends from terminal pad 132 to electrode 112 of FBAR 110, an electrical trace 137 that extends from electrode 114 of FBAR 110 to an interconnection pad 136 in electrical contact with an interconnection pad 176, an electrical trace 139 that extends from interconnection pad 176 to signal pad 138, an electrical trace 177 that extends from interconnection pad 176 to electrode 152 of FBAR 150, an electrical trace 173 that extends from electrode 154 of FBAR 150 to terminal pad 172 and an electrical trace 167 that interconnects terminal pads 132 and 172.

In the exemplary electrical schematic shown in FIG. 5D, electrical circuit 142 connects upper FBARs 120 and 160 in series and to signal terminals 145 and 146 and to optional center-tap terminal 147. In the embodiment shown in FIGS. 5A-5C, terminal pads 134 and 174 provide signal pads 145 and 146 and terminal pad 178 provides center-tap terminal 147. In the embodiment, electrical circuit 142 is provided by an electrical trace 135 that extends from terminal pad 134 to electrode 124 of FBAR 120, an electrical trace 171 that extends from electrode 122 of FBAR 120 to electrode 162 of FBAR 160, an electrical trace 179 that extends from trace 171 to terminal pad 178, and an electrical trace 175 that extends from electrode 164 of FBAR 160 to terminal pad 174. Also shown are terminal pads 163 and 168 interconnected by an electrical trace 169 that provide local grounds for terminal pads 134 and 174. In the example shown, electrical trace 169 additionally extends to terminal pad 178. In other examples, terminal pad 178 is left floating.

The electrical connections exemplified in FIG. 5D provide a FACT with a balanced primary and a 4:1 impedance transformation ratio or a FACT with a balanced secondary and a 1:4 impedance transformation ratio. The lower FBARs may alternatively be interconnected in parallel, series, and anti-series, and the upper FBARs may alternatively be interconnected in parallel, anti-parallel and anti-series to achieve other impedance transformation ratios as shown in Table 1 below.

TABLE 1

|  | Parallel | Series | Anti-parallel. | Anti-series |
| --- | --- | --- | --- | --- |
| Parallel | U 1:1 LOW | X | X | U 1:4 |
| Series | X | B 1:1 HIGH | B 4:1 | X |
| Anti-parallel | X | B 1:4 | B 1:1 LOW | X |
| Anti-series | U 4:1 | X | X | U 1:1 HIGH |

In Table 1, the row captions indicate the configuration of electrical circuit 141, the column captions indicate the configuration of electrical circuit 142, B denotes that the FACT is electrically balanced, U denotes that the FACT is unbalanced, and X denotes a non-functioning FACT. The impedance transformation ratio shown is the impedance transformation from the configuration of electrical circuit 141 indicated by the row caption to the configuration of electrical circuit 142 indicated by the column caption. For the configurations having a 1:1 impedance transformation ratio, LOW denotes that the FACT has a low impedance, equivalent to that of two FBARs in parallel, and HIGH indicates that the FACT has a high impedance, equivalent to that of two FBARs in series.

Wafer-scale fabrication is used to fabricate thousands of FBAR devices similar to above-described FBAR devices 100, 200 or 300 at the same time. Such wafer-scale fabrication makes the FBAR devices inexpensive to fabricate. An example of the fabrication method used to fabricate an embodiment of FBAR device 200 described above with reference to FIGS. 4A and 4B will be described next with reference to the plan views of FIGS. 6A-6J and the cross-sectional views of FIGS. 6K-6T. With different masks and the omission of the procedures described below with reference to FIGS. 6F-6J and 6P-6T, the process can also be used to fabricate embodiments of FBAR device 100 described above with reference to FIGS. 3A-3E. With different masks, the process can also be used to fabricate embodiments of FBAR device 300 described above with reference to FIGS. 5A-5C. The pass band of the embodiment of FBAR device 200 whose fabrication will be described has a nominal center frequency of about 1.9 GHz. Embodiments for operation at other frequencies are similar in structure and fabrication but have thicknesses and lateral dimensions different from those exemplified below. The example of FBAR device 200 whose fabrication will be described below incorporates temperature-compensating layers similar to temperature-compensating layers 115 and 123 described above with reference to FIGS. 4A and 4B. The described process can be modified to fabricate FBAR devices in which the temperature-compensating layers have configurations similar to those described above with reference to FIGS. 3C-3E.

A wafer of single-crystal silicon is provided. A portion of the wafer constitutes, for each FBAR device being fabricated, a substrate corresponding to the substrate 102 of FBAR device 200. FIGS. 6A-6J and FIGS. 6K-6T illustrate and the following description describes the fabrication of FBAR device 200 in and on a portion of the wafer that constitutes substrate 102. As FBAR device 200 is fabricated, the remaining FBAR devices on the wafer are similarly fabricated.

Figure 6A:
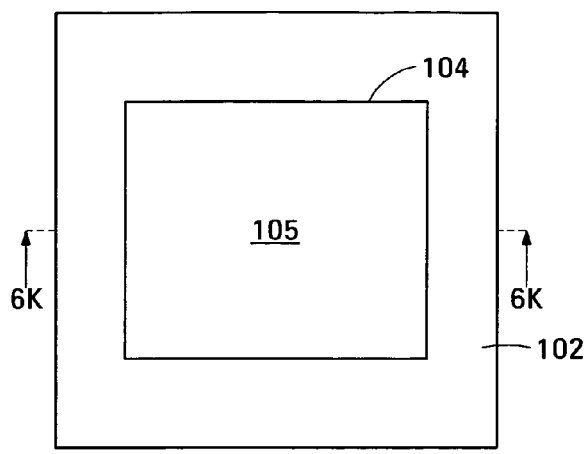
FIGS. 6A-6J are plan views illustrating a process for making an FBAR device in accordance with an embodiment of the invention.
Figure 6K:
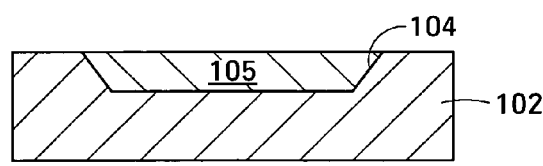
FIGS. 6K-6T are cross-sectional views along the section lines 6K-6K through 6T-6T, respectively, in FIGS. 6A-6J, respectively.

The wafer is selectively wet etched to form a cavity 104, as shown in FIGS. 6A and 6K, in the location of each FBAR device. A layer of sacrificial material (not shown) is deposited on the surface of the wafer with a thickness sufficient to fill each cavity. The surface of the wafer is then planarized, leaving each cavity filled with sacrificial material. FIGS. 6A and 6K show cavity 104 in substrate 102 filled with sacrificial material 105.

In an embodiment, the sacrificial material was phosphosilicate glass (PSG) and was deposited using conventional low-pressure chemical vapor deposition (LPCVD). The sacrificial material may alternatively be deposited by sputtering or by spin coating.

As an alternative to forming and filling cavity 104 with sacrificial material 105, alternating Bragg layers of metal and plastic are deposited on the surface of wafer 102 and are patterned to define an acoustic Bragg reflector as described by Larson III et al. in United States patent application publication no. 2005 0 104 690 entitled Cavity-less Film Bulk Acoustic Resonator (FBAR) Devices, assigned to the assignee of this disclosure and incorporated by reference.

Figure 6B:
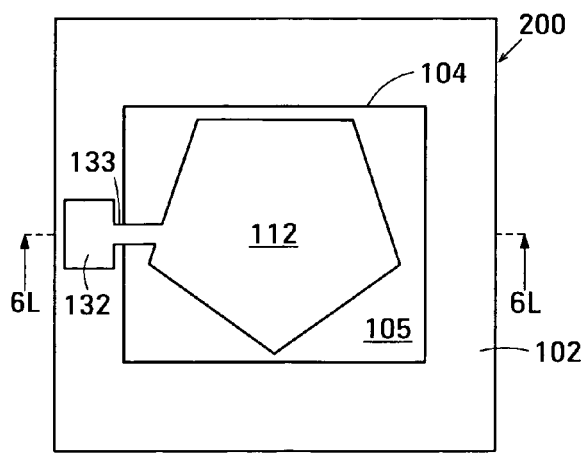
Figure 6L:
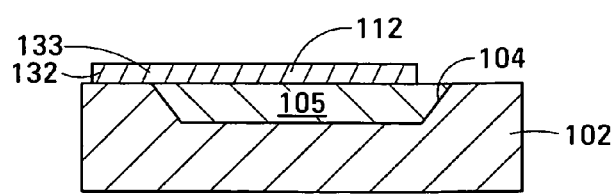

A first metal layer is deposited on the major surface of substrate 102 and sacrificial material 105. The first metal layer is patterned as shown in FIGS. 6B and 6L to define electrode 112, terminal pad 132, and electrical trace 133 extending between electrode 112 and terminal pad 132.

Electrode 112 typically has an asymmetrical shape in a plane parallel to the major surface of the wafer. An asymmetrical shape minimizes lateral modes in FBAR 110 (FIG. 4B) of which electrode 112 forms part. This is described in U.S. Pat. No. 6,215,375 of Larson III et al., assigned to the assignee of this disclosure and incorporated by reference. Electrode 112 leaves part of the surface of sacrificial material 105 exposed so that the sacrificial material can later be removed by etching, as will be described below.

Referring additionally to FIG. 4B, electrode 114 is defined in a second metal layer, electrode 122 is defined in a third metal layer and electrode 124 is defined in a fourth metal layer, as will be described in detail below. The metal layers in which the electrodes are defined are patterned such that, in respective planes parallel to the major surface of the wafer, electrodes 112 and 114 of FBAR 110 have the same shape, size, orientation and position and electrodes 122 and 124 of FBAR 120 have the same shape, size, orientation and position. Typically, electrodes 114 and 122 additionally have the same shape, size, orientation and position.

In an embodiment, the material of each of the metal layers was molybdenum deposited by sputtering to a thickness of about 300 nm. The metal layers were each patterned by dry etching. The electrodes defined in each of the metal layers were pentagonal each with an area of about 12,000 square µm. Other electrode areas give other characteristic impedances. Other metals such as tungsten, niobium and titanium may alternatively be used as the material of the metal layers. The metal layers may each alternatively comprise layers of more than one material.

One factor to be considered in choosing the material of the electrodes of FBAR device 300 is the acoustic properties of the electrode material: the acoustic properties of the material(s) of the remaining metal parts of FBAR device are less important than other properties such as electrical conductivity. Thus, the material(s) of the remaining metal parts of FBAR device 300 may be different from the material of the electrodes.

Figure 6C:
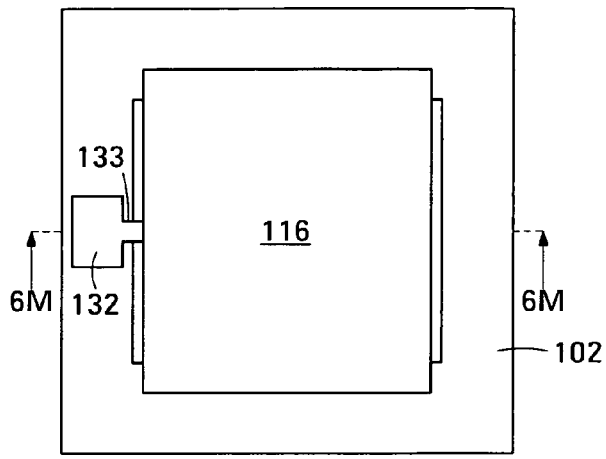
Figure 6M:
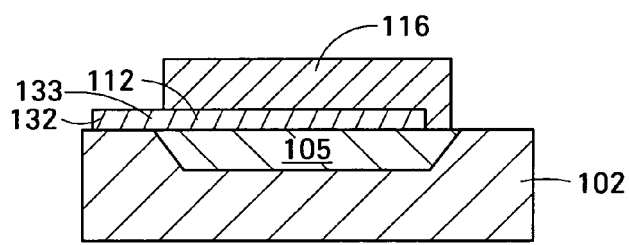

A layer of piezoelectric material is deposited and is patterned as shown in FIGS. 6C and 6M to define piezoelectric element 116. The piezoelectric layer is patterned to cover electrode 112, but to expose terminal pad 132 and part of the surface of sacrificial material 105. Other portions of piezoelectric element 116 extend over substrate 102 outside cavity 104.

In an embodiment, the piezoelectric material deposited to form piezoelectric element 116 and piezoelectric element 126 described below was aluminum nitride and was deposited with a thickness of about 1.4 µm by sputtering. The piezoelectric material was patterned by wet etching in potassium hydroxide or by chlorine-based dry etching. Alternative materials for piezoelectric elements 116 and 126 include zinc oxide (ZnO), cadmium sulfide (CdS) and poled ferroelectric materials such as perovskite ferroelectric materials, including lead zirconium titanate (Pb(Zr,Ti)O$_3$), lead meta niobate (PbNb$_2$O$_6$) and barium titanate (BaTiO$_3$).

Figure 6D:
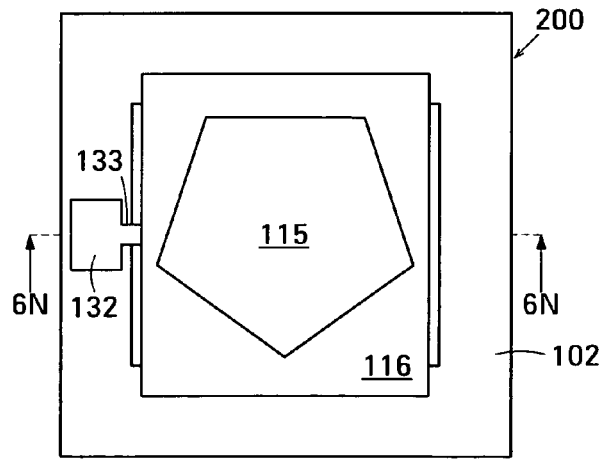
Figure 6N:
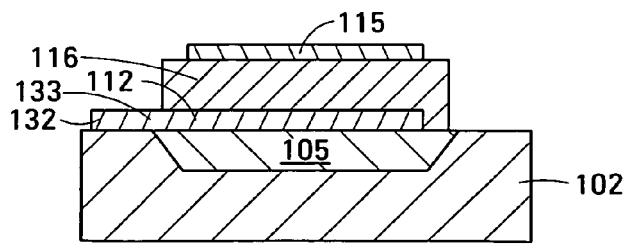

A first layer of temperature-compensating material is deposited and is patterned as shown in FIGS. 6D and 6N to define temperature-compensating layer 115. The temperature-compensating material is patterned to have the same shape, size, orientation and position as electrode 112.

In an embodiment, the material of the first layer of temperature-compensating material was silicon dioxide doped with boron. Undoped silicon dioxide was deposited by chemical vapor deposition (CVD) using tetraethylorthosilicate (TEOS—Si(OC$_2$H$_5$)$_4$) and oxygen as precursors and was patterned by etching in hydrofluoric acid. Alternative silicon precursors include silane (SiH$_4$) and disilane (Si$_2$H$_6$). The layer thickness depended on the desired temperature coefficient of FBAR device 200 (FIG. 4A). In one example, the layer thickness was 80 nm. The silicon dioxide was then implanted with boron ions at an energy of about 30 keV until a doping density of about $2.5 \times 10^{15}$ cm$^{-3}$ was achieved.

In another embodiment, the implantation process was performed before the patterning process. In this case, the patterning was performed using a dry etch process having a fluorine-based etch chemistry. In yet another embodiment, the implantation process is performed using ions of a different group III element, such as aluminum, gallium or indium, and is performed before or after the patterning process. In yet another embodiment, boron tribromide (BBr$_3$) or another suitable boron precursor was additionally introduced into the CVD growth chamber during the SiO$_2$ growth process to grow doped silicon dioxide. The doped silicon dioxide was then patterned using the above-described fluorine-based dry etch process. Precursors for other group III elements may alternatively be used.

Figure 6E:
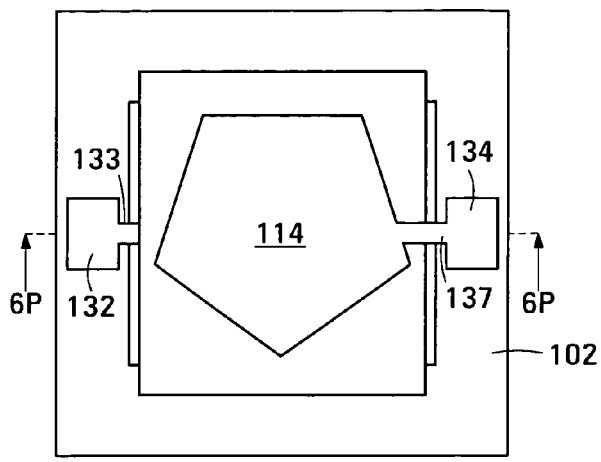
Figure 6O:
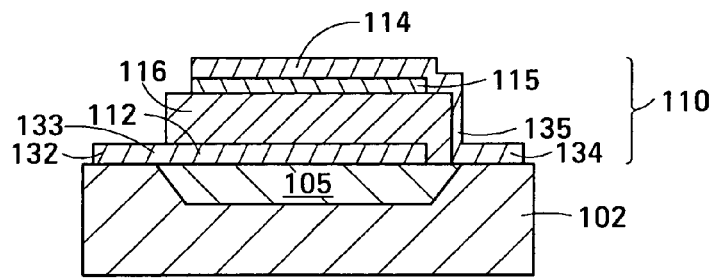

The second metal layer is deposited and is patterned to define electrode 114, terminal pad 134 and electrical trace 135 extending between electrode 114 and terminal pad 134, as shown in FIGS. 6E and 6O. This completes fabrication of FBAR 110.

Figure 6F:
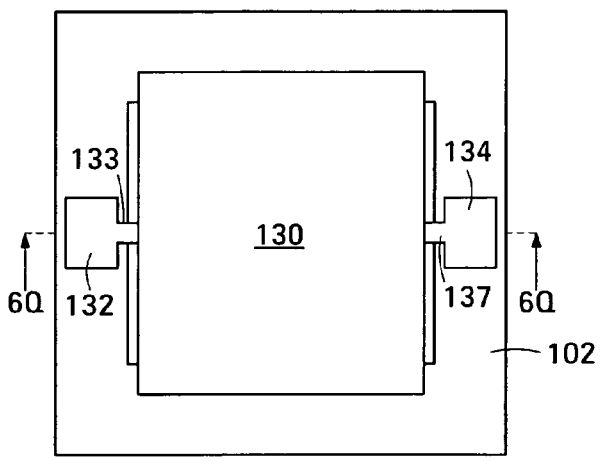
Figure 6P:
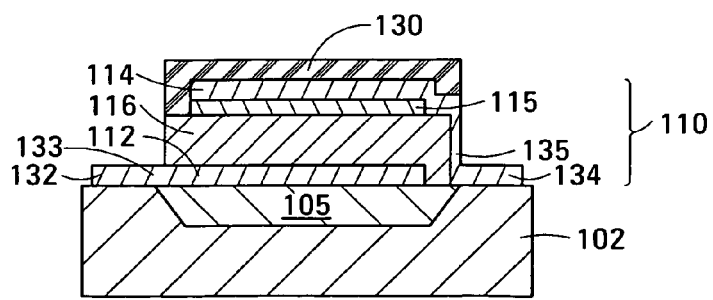

A layer of acoustic decoupling material is then deposited and is patterned to define acoustic decoupler 130, as shown in FIGS. 6F and 6P. Acoustic decoupler 130 is patterned to cover at least electrode 114, and is additionally patterned to expose terminal pads 132 and 134 and part of sacrificial material 105. Acoustic decoupler 130 is typically a one quarter-wave layer of plastic material.

In an embodiment, the acoustic decoupling material of acoustic decoupler 130 was polyimide with a thickness of about 200 nm. This is the thickness of a one quarter wave layer of the polyimide. The polyimide was deposited by spin coating, and was patterned by photolithography. Polyimide is photosensitive so that no photoresist is needed. As noted above, other plastic materials can be used as the acoustic decoupling material. The acoustic decoupling material can be deposited by methods other than spin coating.

In an embodiment in which the acoustic decoupling material was polyimide, after depositing and patterning the polyimide, the wafer was baked initially at a temperature of about 250° C. in air and finally at a temperature of about 415° C. in an inert atmosphere, such as a nitrogen atmosphere, before further processing was performed. The bake evaporates volatile constituents of the polyimide and prevents the evaporation of such volatile constituents during subsequent processing from causing separation of subsequently-deposited layers.

Figure 6G:
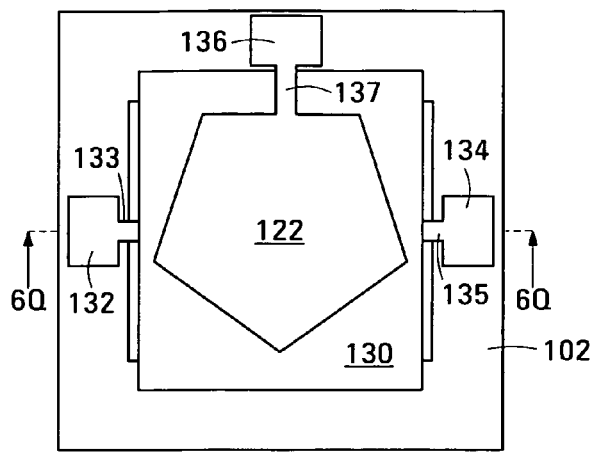
Figure 6Q:
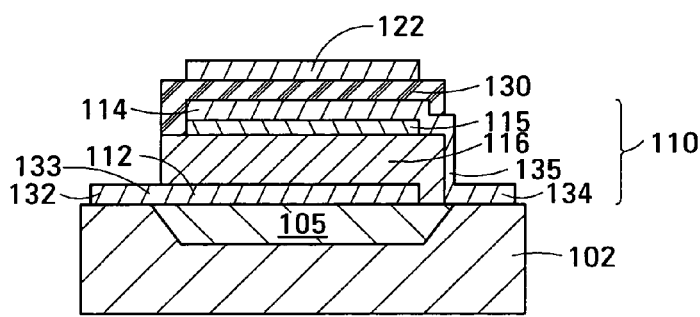

The third metal layer is deposited and is patterned to define electrode 122, terminal pad 136, and electrical trace 137 extending from electrode 122 to terminal pad 136, as shown in FIGS. 6G and 6Q.

Figure 6H:
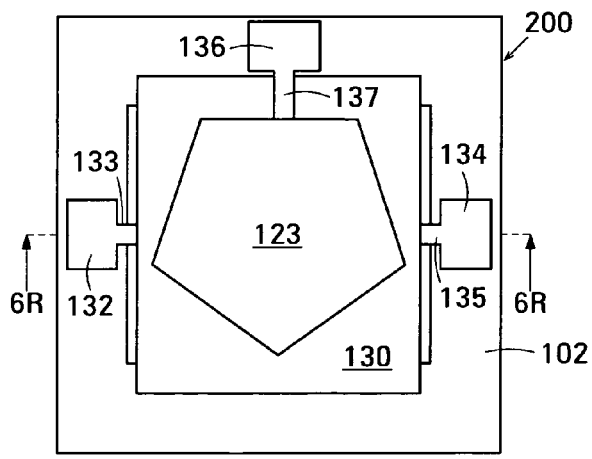
Figure 6R:
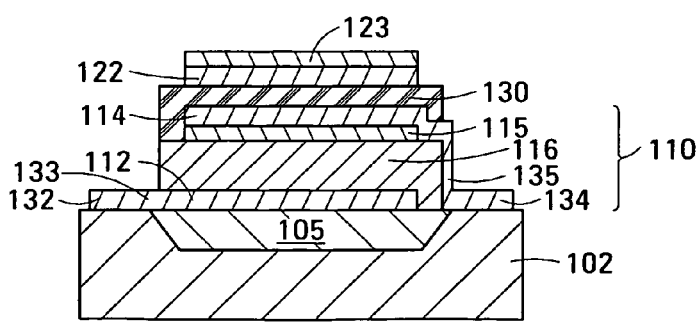

The second layer of temperature-compensating material is deposited and is patterned as shown in FIGS. 6H and 6R to define temperature-compensating layer 123. The temperature-compensating material is patterned to have the same shape, size, orientation and position as electrode 122.

In an embodiment, the material of the second layer of temperature-compensating material was silicon dioxide doped with boron. Undoped silicon dioxide was deposited by chemical vapor deposition (CVD) using tetraethylorthosilicate (TEOS—$Si(OC_2H_5)_4$) and oxygen as precursors and was patterned by etching in hydrofluoric acid. Alternative silicon precursors include silane ($SiH_4$) and disilane ($Si_2H_6$). Undoped silicon dioxide was deposited by chemical vapor deposition (CVD) using silane and oxygen as precursors and was patterned by etching in hydrofluoric acid. The layer thickness depended on the desired temperature coefficient of FBAR device 200 (FIG. 4A). In one example, the layer thickness was 80 nm. The silicon dioxide was then implanted with boron ions at an energy of about 30 keV until a doping density of about $2.5 \times 10^{15}$ $cm^{-}$ was achieved.

In another embodiment, the implantation process was performed before the patterning process. In this case, the patterning was performed using the above-described fluorine-based dry etch process. In yet another embodiment, the implantation process is performed using ions of a different group III element, such as aluminum, gallium or indium and was performed before or after the patterning process. In yet another embodiment, boron tribromide ($BBr_3$) or another suitable boron precursor was additionally introduced into the CVD growth chamber during the $SiO_2$ growth process to grow doped silicon dioxide. The doped silicon dioxide was then patterned using the above-described fluorine-based dry etch process. Precursors for other group III elements may alternatively be used.

Figure 6I:
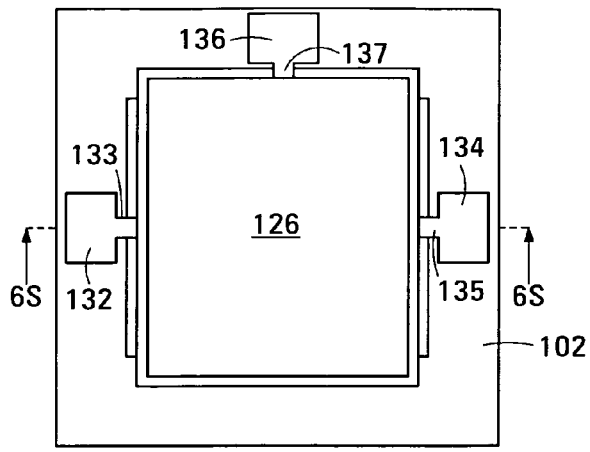
Figure 6S:
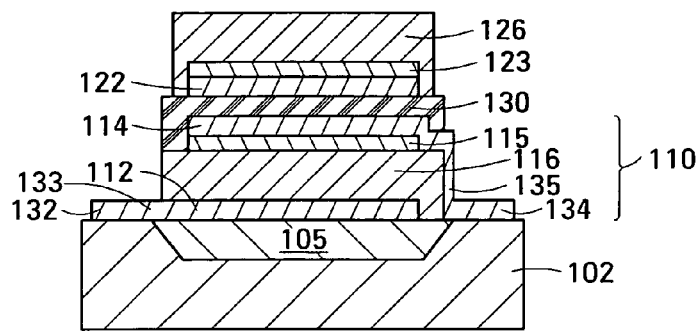

The second layer of piezoelectric material is deposited and is patterned as shown in FIGS. 6I and 6S to define piezoelectric element 126. The second piezoelectric layer is patterned to expose terminal pads 132, 134 and 136 and part of sacrificial material 105.

Figure 6J:
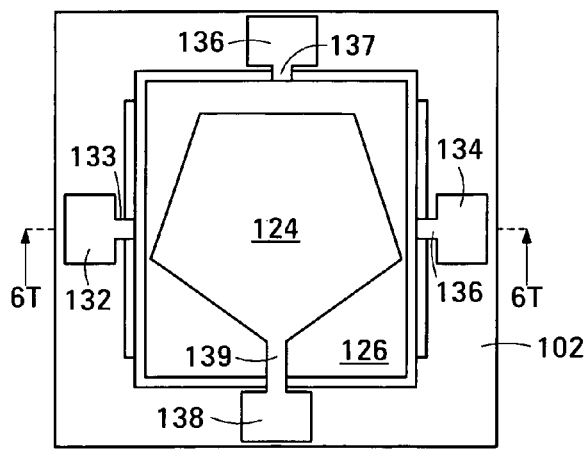
Figure 6T:
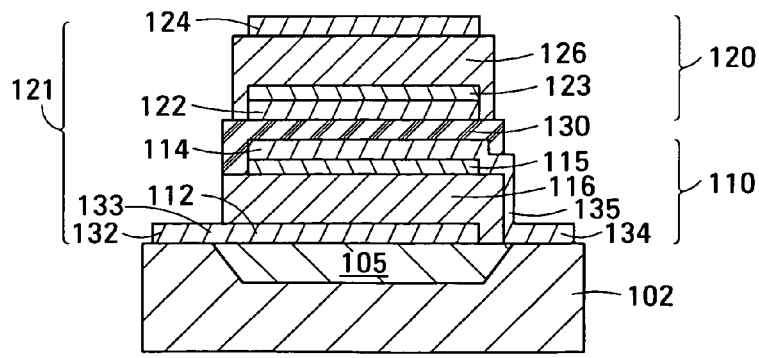

The fourth metal layer is deposited and is patterned to define electrode 124, terminal pad 138 and an electrical trace 139 extending from electrode 124 to terminal pad 138, as shown in FIGS. 6J and 6T. This completes fabrication of FBAR 120 and FBAR stack 211.

A gold protective layer (not shown) is deposited on the exposed surfaces of terminal pads 132, 134, 136 and 138.

A release etch is performed to remove sacrificial material 105 from cavity 104. This leaves FBAR device 200 suspended over cavity 104, as shown in FIGS. 4A and 4B.

In an embodiment in which the sacrificial material 105 was phosphosilicate glass (PSG), the release etchant was hydrofluoric acid diluted with water. Although doped $SiO_2$ temperature compensating layers 115 and 123 were exposed to the etchant during the release etch, etching of the temperature-compensating layers was minimal.

The wafer is then divided into individual FBAR devices, including FBAR device 200.

FBAR device 200 is mounted in a host electrical apparatus, such as a wireless telephone, and electrical connections are made between terminal pads 132, 134, 136 and 138 of the FBAR device and pads that are part of the host device.

As noted above, an alternative acoustic decoupling material of acoustic decoupler 130 is a crosslinked polyphenylene polymer. An embodiment of acoustic decoupler 130 in which the acoustic decoupling material is a crosslinked polyphenylene polymer is fabricated as follows. After the third metal layer has been patterned to define electrode 114, as described above with reference to FIGS. 6E and 6O, the precursor solution for the crosslinked polyphenylene polymer is spun on in a manner similar to that described above with reference to FIGS. 6F and 6P, but is not patterned. The formulation of the precursor solution and the spin speed are selected so that the crosslinked polyphenylene polymer forms a layer with a thickness of about 187 nm. This is the thickness of a one quarter-wave layer of the crosslinked polyphenylene polymer. After depositing the layer of the precursor solution, the wafer was baked at a temperature in the range from about 385° C. to about 450° C. in an inert ambient, such as under vacuum or in a nitrogen atmosphere, before further processing is performed. The bake first drives off the organic solvents from the precursor solution, and then causes the oligomer to cross link as described above to form the crosslinked polyphenylene polymer.

In an embodiment, the precursor solution for the crosslinked polyphenylene polymer was one sold by The Dow Chemical Company and designated SiLK™ J. Alternatively, the precursor solution may be any suitable one of the precursor solutions now or in the future sold by The Dow Chemical Company under the trademark SiLK. In certain embodiments, a layer of an adhesion promoter was deposited before the precursor solution was spun on. Precursor solutions containing oligomers that, when cured, form a crosslinked polyphenylene polymer having an acoustic impedance of about 2 Mrayl may be available from other suppliers now or in the future and may also be used.

The third metal layer is then deposited on the layer of the crosslinked polyphenylene polymer in a manner similar to that described above with reference to FIGS. 6G and 6Q, but is initially patterned similarly to the patterning of acoustic decoupler 130 shown in FIG. 6F to define a hard mask that will later be used to pattern the layer of the crosslinked polyphenylene polymer to define acoustic decoupler 130. The initially-patterned third metal layer has the same extent as acoustic decoupler 130 and exposes terminal pads 132 and 134 and parts of sacrificial material 105.

The layer of the crosslinked polyphenylene polymer is then patterned as shown in FIG. 6F with the initially-patterned third metal layer being used as a hard etch mask. Patterning the layer of the crosslinked polyphenylene polymer defines the extent of acoustic decoupler 130, which exposes terminal pads 132 and 134 and parts of sacrificial material 105. The patterning is performed with an oxygen plasma etch.

The third metal layer is then re-patterned as shown in FIGS. 6G and 6Q to define electrode 122, terminal pad 136 and electrical trace 137 extending between electrode 122 and terminal pad 136.

Fabrication of the embodiment of FBAR device 200 with a layer of a crosslinked polyphenylene polymer as its acoustic decoupler is completed by performing the processing described above with reference to FIGS. 6H-6J and 6R-6T.

A similar technique similar to that just describe can be used to define acoustic decoupler 103 in a layer of parylene deposited by vacuum deposition.

The above-exemplified electrode and piezoelectric element thicknesses are thicknesses for a conventional FBAR device similar to an embodiment of FBAR 200 without temperature-compensating layers 115 and 123. In an embodiment of FBAR device 200, one or more of the thicknesses are reduced to maintain the center frequency of the FBAR device notwithstanding the addition of temperature-compensating layers 115 and 123 to FBAR stack 211. The identity of the one or more elements whose thicknesses are reduced and the respective thickness reductions depends on the thicknesses of temperature-compensating layers 115 and 123 and the amount of temperature compensation provided by the temperature-compensating layers The identity of the elements and the thickness reductions additionally depends on the application in which the FBAR device will be used, as described above. Reducing the thickness of piezoelectric elements typically reduces the coupling constant: reducing the thickness of one or more of the electrodes typically increases the series resistance. A device designer may choose to use thicknesses of temperature-compensating layers 115 and 123 thinner than those that result in the resonant frequency of the FBAR device having a temperature coefficient of zero. The resulting FBAR device has a non-zero temperature coefficient that is nevertheless less than that of an otherwise similar FBAR device without temperature compensation. Such an FBAR device may have properties that are preferable to an FBAR device having a zero temperature coefficient due to the smaller reductions in the thicknesses of either or both of the piezoelectric elements and the electrodes resulting from the thinner temperature-compensating layers.

This disclosure describes the invention in detail using illustrative embodiments. However, the invention defined by the appended claims is not limited to the precise embodiments described.

We claim:

1. A temperature-compensated film bulk acoustic resonator (FBAR) device, comprising:
an FBAR stack, comprising:
an FBAR characterized by a resonant frequency having a temperature coefficient, the FBAR comprising opposed planar electrodes and a piezoelectric element between the electrodes, the piezoelectric element having a temperature coefficient on which the temperature coefficient of the resonant frequency depends at least in part, and a temperature-compensating layer between the electrodes comprising doped silicon dioxide.

2. The FBAR device of claim 1, in which the temperature-compensating layer is juxtaposed with one of the electrodes.

3. The FBAR device of claim 2, in which the FBAR stack additionally comprises an additional temperature-compensating layer juxtaposed with the other of the electrodes, the additional temperature-compensating layer comprising doped silicon dioxide.

4. The FBAR device of claim 3, in which the additional temperature-compensating layer is located between the other of the electrodes and the piezoelectric element.

5. The FBAR device of claim 2, in which the temperature-compensating layer is located between the one of the electrodes and the piezoelectric element.

6. The FBAR device of claim 2, in which the one of the electrodes is located between the temperature-compensating layer and the piezoelectric element.

7. The FBAR device of claim 2, in which: the FBAR is a lower FBAR; and the FBAR stack additionally comprises: an upper FBAR stacked on the lower FBAR, the upper FBAR comprising opposed planar electrodes and a piezoelectric element between the electrodes, and an acoustic decoupler between the FBARs.

8. The FBAR device of claim 7, in which the FBAR stack additionally comprises a temperature-compensating layer juxtaposed with one of the electrodes of each of the FBARs, the temperature-compensating layer comprising doped silicon dioxide.

9. The FBAR device of claim 8, in which, in each of the FBARs, the one of the electrodes is juxtaposed with the acoustic decoupler.

10. The FBAR device of claim 7, in which: the first FBAR, the second FBAR and the acoustic decoupler constitute a first decoupled stacked bulk acoustic resonator (DSBAR); the FBAR stack additionally comprises a second DSBAR, comprising a lower FBAR, an upper FBAR stacked on the lower FBAR, and an acoustic decoupler between the FBARs; and the FBAR device additionally comprises: a first electrical circuit interconnecting the lower FBARS, and a second electrical circuit interconnecting the upper FBARs.

11. The FBAR device of claim 10, in which the FBAR stack additionally comprises a temperature-compensating layer juxtaposed with one of the electrodes of each of the FBARs, the temperature-compensating layer comprising doped silicon dioxide.

12. The FBAR device of claim 2, in which: the FBAR is a first FBAR; the FBAR stack additionally comprises one or more additional FBARs; and the FBARs are interconnected as a ladder filter.

13. The FBAR device of claim 12, in which the FBAR stack additionally comprises a temperature-compensating layer juxtaposed with one of the electrodes of each of the FBARs, the temperature-compensating layer comprising doped silicon dioxide.

14. The FBAR device of claim 1, in which the temperature-compensating layer is embedded in the piezoelectric element.

15. The FBAR device of claim 14, in which: the FBAR is a lower FBAR; and the FBAR device additionally comprises: an upper FBAR stacked on the lower FBAR, the upper FBAR comprising opposed planar electrodes and a piezoelectric element between the electrodes, and an acoustic decoupler between the FBARs.

16. The FBAR device of claim 15, in which the FBAR stack additionally comprises a temperature-compensating layer embedded in the piezoelectric element of each of the FBARs, the temperature-compensating layer comprising doped silicon dioxide.

17. The FBAR device of claim 15, in which: the lower FBAR, the upper FBAR and the acoustic decoupled constitute a first decoupled stacked bulk acoustic resonator (DSBAR); the FBAR stack additionally comprises a second DSBAR, comprising a lower FBAR, an upper FBAR, an acoustic decoupled between the FBARs; and the FBAR device additionally comprises: a first electrical circuit interconnecting the lower FBARs, and a second electrical circuit interconnecting the upper FBARs.

18. The FBAR device of claim 17, in which the FBAR stack additionally comprises a temperature-compensating layer embedded in the piezoelectric element of each of the FBARs.

19. The FBAR device of claim 15, in which: the FBAR is a first FBAR; the FBAR stack additionally comprises one or more additional FBARs; and the FBARs are interconnected as a ladder filter.

20. The FBAR device of claim 19, in which the FBAR stack additionally comprises a temperature-compensating layer embedded in the piezoelectric element of each of the FBARs, the temperature-compensating layer comprising doped silicon dioxide.

21. The FBAR device of claim 1, in which: the FBAR is a lower FBAR; the FBAR stack additionally comprises: an upper FBAR stacked on the lower FBAR, and an acoustic decoupler between the FBARs, the acoustic decoupler comprising a Bragg structure; and the temperature-compensating layer constitutes a layer of the Bragg structure.

22. A temperature-compensated film bulk acoustic resonator (FBAR) device, comprising:
an FBAR stack, comprising:
an FBAR characterized by a resonant frequency having a temperature coefficient, the FBAR comprising opposed planar electrodes and a piezoelectric element between the electrodes, the piezoelectric element having a temperature coefficient on which the temperature coefficient of the resonant frequency depends at least in part, and a temperature-compensating layer between the electrodes comprising silicon dioxide doped with a group III element.

23. The FBAR device of claim 22, in which the group III element is boron.

24. The FBAR device of claim 22, in which the group III element is one of aluminum, gallium and indium.

25. The FBAR device of claim 22, in which the silicon dioxide is doped by implanting ions of the group III element.

26. The FBAR device of claim 22, in which the temperature-compensating layer is fabricated by depositing silicon dioxide by chemical vapor deposition (CVD).

27. The FBAR device of claim 26, in which the group III element is additionally deposited by CVD.

28. A temperature-compensated film bulk acoustic resonator (FBAR) device, comprising:
a substrate defining a cavity; an FBAR stack suspended over the cavity, the FBAR stack comprising:
an FBAR characterized by a resonant frequency having a temperature coefficient, the FBAR comprising opposed planar electrodes and a piezoelectric element between the electrodes, the piezoelectric element having a temperature coefficient on which the temperature coefficient of the resonant frequency depends at least in pad, and a temperature-compensating layer between the electrodes comprising silicon dioxide implanted with ions of a group III element.

29. The FBAR device of claim 28, in which the group III element is boron.

30. The FBAR device of claim 28, in which the group III element is one of aluminum, gallium and indium.

31. A method of making an FBAR device, the method comprising:
providing a substrate having a cavity defined therein, the cavity filled with sacrificial material;
forming an FBAR stack over the sacrificial material, the forming comprising depositing between opposed electrodes a temperature-compensating layer comprising a doped temperature-compensating material; and
removing the sacrificial material from the cavity using an etchant that is incompatible with the temperature-compensating material in its undoped form.

32. The method of claim 31, in which the doped temperature-compensating material is doped silicon dioxide, the sacrificial material is phosphosilicate glass and the etchant is dilute hydrofluoric acid.

33. The method of claim 32, in which the silicon dioxide is doped with a group III element.

34. The method of claim 33, in which the group III element is boron.

35. The method of claim 31, in which depositing the temperature-compensating layer comprises depositing a layer of silicon dioxide and implanting ions of the group III element into the silicon dioxide.

36. The method of claim 35, in which the group III element is boron.

37. An acoustic device, comprising an acoustic propagation path having a propagation time-related property, the propagation time-related property having a temperature coefficient, the acoustic propagation path comprising: an acoustic propagation element having a temperature coefficient on which the propagation time-related property of the acoustic propagation path depends at least in part; and a temperature-compensating layer comprising doped silicon dioxide between opposed electrodes, the doped silicon dioxide having a temperature coefficient opposite in sign to the temperature coefficient of the acoustic propagation element.

38. The acoustic device of claim 37, in which the silicon dioxide is doped with a group III element.

* * * * *

UNITED STATES PATENT AND TRADEMARK OFFICE
CERTIFICATE OF CORRECTION

PATENT NO. : 7,561,009 B2
APPLICATION NO. : 11/291674
DATED : July 14, 2009
INVENTOR(S) : John D. Larson, III et al.

Page 1 of 1

It is certified that error appears in the above-identified patent and that said Letters Patent is hereby corrected as shown below:

Column 22, Line 34, Claim 10, delete "FBARS," and insert --FBARs,--.

Column 22, Lines 34-35, Claim 10, delete "electrieal" and insert --electrical--.

Column 22, Line 64, Claim 17, delete "decoupled" and insert --decoupler--.

Column 23, Line 1, Claim 17, delete "decoupled" and insert --decoupler--.

Column 24, Line 4, Claim 28, delete "pad," and insert --part,--.

Signed and Sealed this
Second Day of October, 2012

David J. Kappos
*Director of the United States Patent and Trademark Office*